US012808047B2

(12) United States Patent
Lehn

(10) Patent No.: US 12,808,047 B2
(45) Date of Patent: Nov. 24, 2026

(54) ATOMIC LAYER DEPOSITION USING TIN-BASED OR GERMANIUM-BASED PRECURSORS

(71) Applicant: Micron Technology, Inc., Boise, ID (US)

(72) Inventor: Jean-Sebastien Materne Lehn, Boise, ID (US)

(73) Assignee: Micron Technology, Inc., Boise, ID (US)

(*) Notice: Subject to any disclaimer, the term of this patent is extended or adjusted under 35 U.S.C. 154(b) by 97 days.

(21) Appl. No.: 18/434,588

(22) Filed: Feb. 6, 2024

(65) Prior Publication Data

US 2024/0287677 A1 Aug. 29, 2024

Related U.S. Application Data

(60) Provisional application No. 63/484,728, filed on Feb. 13, 2023.

(51) Int. Cl.
*C23C 16/455* (2006.01)

(52) U.S. Cl.
CPC .............................. *C23C 16/45553* (2013.01)

(58) Field of Classification Search
CPC . C23C 16/45553; C23C 16/30; C23C 16/305; C23C 16/45527
See application file for complete search history.

(56) References Cited

U.S. PATENT DOCUMENTS

2012/0021590 A1 1/2012 Ishii et al.
2012/0171812 A1* 7/2012 Marsh ................. H10N 70/023 438/102

(Continued)

FOREIGN PATENT DOCUMENTS

JP 2016-084544 A 5/2016
WO 2009/152108 A2 12/2009

OTHER PUBLICATIONS

"International Search Report and Written Opinion of the International Searching Authority," issued in connection with Int'l Appl. No. PCT/US2024/014816, dated May 31, 2024 (8 pages).

(Continued)

*Primary Examiner* — Michael G Miller
(74) *Attorney, Agent, or Firm* — Holland & Hart LLP

(57) ABSTRACT

Methods, systems, and devices for atomic layer deposition using tin-based or germanium-based precursors are described. For instance, a device may react a first precursor with a material to form a first compound including a first element on the material, where the first compound includes at least one of a Group XIII, Group XIV, or Group XV element. Additionally, the device may react a second precursor with the first compound to form a second compound on the base material, where the second precursor has the chemical formula B-C(1)-D(1), B-C(1)-C(1)-D(1), B-C(2)-D(1)D(2), BD(3)-C(2)-C(2)-D(1)D(2), B-C(3)-D(1)D(2)D(3), or BD(4)D(5)-C(3)-C(3)-D(1)D(2)D(3), where each of B, D(1), D(2), D(3), D(4), and D(5) are a respective moiety that independently includes at least one of germanium, tin, or silicon, and where C(1) comprises tellurium, sulfur, or selenium, where C(2) comprises antimony, arsenic, and phosphorous, and where C(3) comprises silicon, germanium, or tin.

14 Claims, 6 Drawing Sheets

(56) References Cited

U.S. PATENT DOCUMENTS

| | | | |
|---|---|---|---|
| 2014/0308802 | A1 | 10/2014 | Xiao et al. |
| 2020/0152867 | A1 | 5/2020 | Chiang et al. |
| 2020/0251334 | A1 | 8/2020 | Fabreguette et al. |
| 2023/0304147 | A1 | 9/2023 | Lehn |

OTHER PUBLICATIONS

European Patent Office, "Extended Search Report," issued in connection with European Patent Application No. 24757442.9 dated Oct. 5, 2026 (13 pages).

Japan Patent Office, "Office Action," issued in connection with Japan Patent Application No. 2025-546406 dated Sep. 1, 2026 (12 pages) (6 pages of English Translation and 6 pages of Original Document).

Kim, W., et al., "Atomic layer deposition of GeSe films using HGeCland [(CH)Si]Se with the discrete feeding method for the ovonic threshold switch", Nanotechnology IOP Publishing, vol. 29, No. 36, Jul. 2, 2018, p. 365202.

Koch, V., M., et al, "Sb<sub>2</sub>Se<sub>3</sub> Thin-Film Growth by Solution Atomic Layer Deposition", Chemistry of Materials, vol. 34, No. 21, Oct. 21, 2022, pp. 939-9401.

Zazpe, R., et al., "Atomic Layer Deposition of MoSe2 Using New Selenium Precursors", Flatchem, vol. 21, May 1, 2020, p. 100166.

* cited by examiner

ATOMIC LAYER DEPOSITION USING TIN-BASED OR GERMANIUM-BASED PRECURSORS

CROSS REFERENCE

The present Application for Patent claims priority to U.S. Patent Application No. 63/484,728 by Lehn, entitled "ATOMIC LAYER DEPOSITION USING TIN-BASED OR GERMANIUM-BASED PRECURSORS," filed Feb. 13, 2023, which is assigned to the assignee hereof, and which is expressly incorporated by reference herein.

FIELD OF TECHNOLOGY

The following relates to one or more systems for memory, including atomic layer deposition using tin-based or germanium-based precursors.

BACKGROUND

Atomic layer deposition (ALD) is a technique used to deposit a film on a first material. For instance, performing ALD may include exposing the first material to a first precursor to form a second material on the first material. Additionally, performing ALD may include exposing the second material to a second precursor, where the second precursor may react with the second material to leave a third material on the surface of the first material. In some examples, the process may repeat, where the third material may be exposed to the first precursor to form another instance of the second material on the third material, and then the other instance of the second material may be exposed to the second precursor to leave another instance of the third material on the surface of the previously formed instance of the third material.

In some examples, reactions involved in ALD may occur at various temperatures. However, if such temperatures are outside of a predefined range for a threshold duration, other materials in a vicinity to the material being exposed to ALD may experience a change in physical or chemical properties beyond an expected threshold. Such changes in physical or chemical properties may adversely affect an operation of an electronic device that includes these other materials (e.g., may decrease a lifetime of the electronic device, may increase a likelihood that the electronic device displays errant behavior or does not perform its intended function). For some materials, the temperature in order to facilitate reactions (e.g., for forming the third material) in ALD may exceed the predefined range for the threshold duration. Accordingly, materials whose reactions may be facilitated to be within the predefined range or to be outside of the predefined range for less than the predefined duration, may decrease a likelihood that the operation of the electronic device is adversely affected.

DETAILED DESCRIPTION

In some examples, a selenide film may be deposited on a material by performing ALD with a silicon-based precursor. However, in order for the selenide film to form on the material, the ambient temperature may be set with a high enough value such that physical or chemical characteristics of other materials in the same vicinity as the material may be adversely affected. For instance, the electronic device may be more likely to display errant behavior or may not perform its intended function due to a change in the physical or chemical properties of such materials. Accordingly, a precursor capable of forming the selenide film at a lower temperature may decrease a likelihood that the operation of the electronic device is adversely affected.

As described in the present disclosure, precursors that include germanium or tin in place of silicon (e.g., bis(trimethylgermyl)selenide or bis(trimethylstannyl)selenide) may enable formation of selenide films at a lower temperature as compared to one or more precursors that include silicon (e.g., bis(trimethylsilyl)selenide), as the reactivity of germanium and tin may be higher than that of silicon. Additionally or alternatively, such precursors may enable an increased rate of formation of selenide films for a given temperature as compared to one or more silicon-based precursors. It should be noted that the methods described herein may have similar advantages for tellurium-based films, sulfur-based films, antimony-based films, arsenic-based films, phosphorous-based films, germanium-based films, tin-based films, or any combination thereof.

In one example of the methods disclosed herein, the method may include reacting a first precursor with a material to form a first compound including a first element on the base material, where the first compound includes at least one of a Group XIII, Group XIV, or Group XV element. Additionally, the method may include reacting a second precursor with a first compound to form a second compound on the base material, where the second precursor includes germanium, tin, or silicon.

Features of the disclosure are initially described in the context of an ALD process and a material deposition process as described with reference to FIGS. 1 and 2. Features of the disclosure are described in the context of an electronic device as described with reference to FIG. 3. These and other features of the disclosure are further illustrated by and described with reference to an apparatus diagram and flowcharts that relate to atomic layer deposition using tin-based or germanium-based precursors as described with reference to FIGS. 4 through 6.

Figure 1:
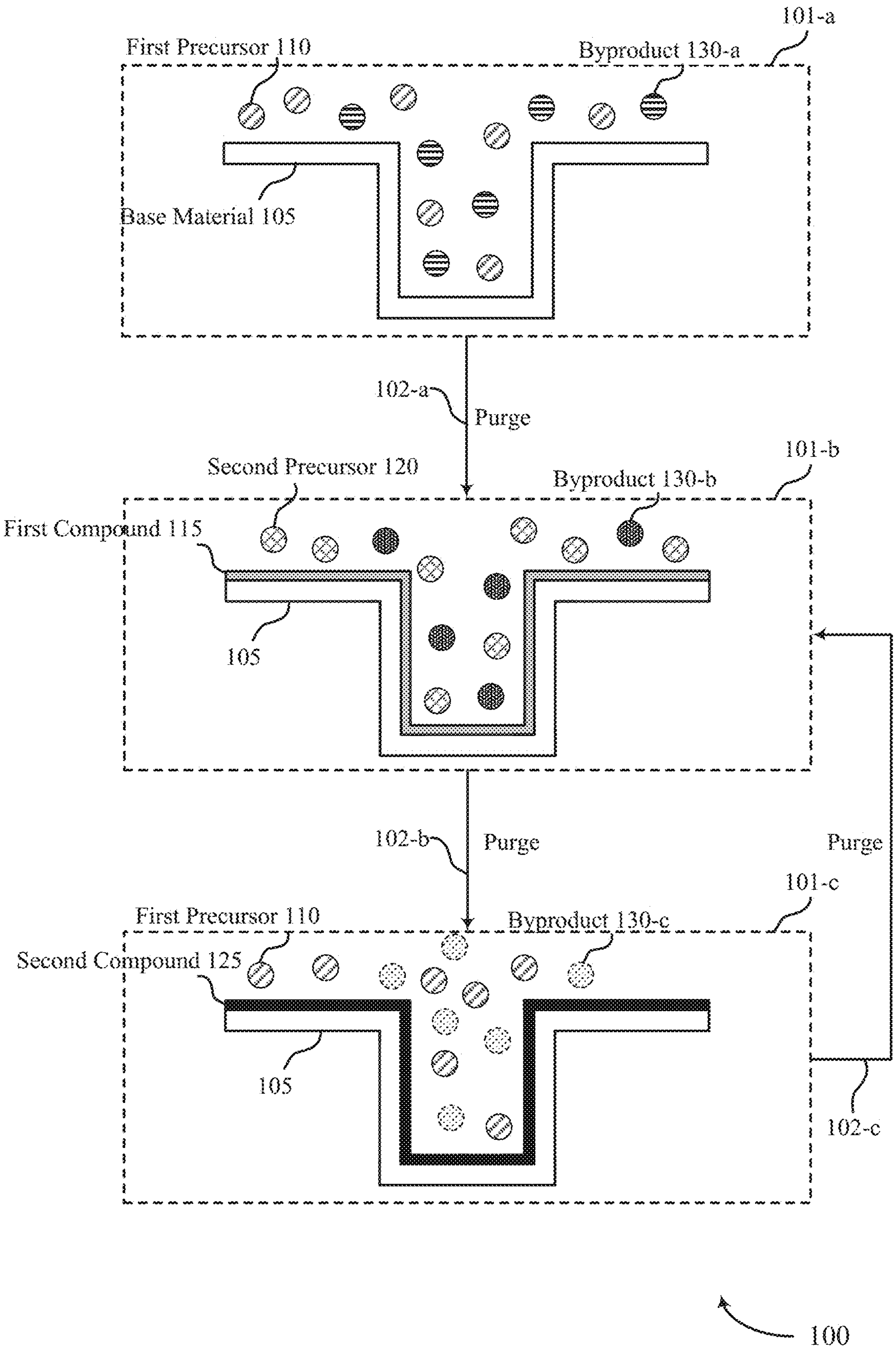
FIG. 1 illustrates an example of an atomic layer deposition (ALD) process that support atomic layer deposition using tin-based or germanium-based precursors in accordance with examples as disclosed herein.

FIG. 1 illustrates an example of an ALD process 100 that supports atomic layer deposition using tin-based or germanium-based precursors in accordance with examples as disclosed herein.

As illustrated in stage 101-*a*, a base material 105 may be exposed to a first precursor 110. For instance, the base material 105 may be located in a reactor (e.g., deposition chamber) within which a gaseous phase of the first precursor 110 may be introduced. Exposing the base material to the first precursor may enable a first compound 115 to form on the surface of the base material 105, as depicted in stage 101-*b*. In some examples, as a result of the reaction between base material 105 and first precursor 110, a byproduct 130-*a* will be formed. After forming first compound 115, a byproduct 130-*a* may be formed; in that case, the by-product 130-*a* and/or a portion of the first precursor 110 may be purged (e.g., removed from the reactor) at 102-*a* before proceeding to stage 101-*b*. In some examples, the temperature of the reactor may be set or adjusted to a first predefined value such that the first compound 115 forms on the surface of the base material 105. In some examples, the base material may be a substrate. In some examples, exposing a material to a precursor may refer to adding the precursor to the reactor within which the material is located, whereas reacting the material with the precursor may refer to a chemical reaction that occurs between the precursor and the material and may involve setting or adjusting a temperature of the reactor to a particular temperature that facilitates the reaction.

After forming the first compound 115 at stage 101-*a*, the first compound 115 may be exposed to a second precursor 120 at stage 101-*b*. For instance, a gaseous phase of the second precursor 120 may be introduced into the reactor and exposed to the surface of the first compound 115. In some examples, the base material 105 may be transported to a second reactor for introducing the second precursor 120. In other examples, the same reactor may be used. The second precursor 120 may react with the first compound 115 to form a second compound 125, as shown in stage 101-*b*. In some examples, as a result of the reaction between first compound 115 and second precursor 120, a byproduct 130-*b* will be formed. After forming second compound 125, the byproduct 130-*b* and/or at least a portion of the second precursor 120 may be purged (e.g., removed from the reactor) at 102-*b* before proceeding to stage 101-*c*. In some examples, the temperature of the reactor may be set or adjusted to a second predefined value such that the second compound 125 forms on the surface of the base material 105.

After forming the second compound 125 at stage 101-*b*, the second compound 125 may be exposed to a first precursor 110 at stage 101-*c*. For instance, a gaseous phase of the first precursor 110 may be introduced to the reactor and exposed to the surface of the second compound 125. In some examples, the base material 105 may be transported to a third reactor for introducing the first precursor 110. In other examples, the same reactor may be used for stage 101-*c* as used for one or both of stages 101-*a* and 101-*b*. The first precursor 110 may react with the second compound 125 to form a second instance of the first compound 115 on top of the second compound 125. In some examples, as a result of the reaction between second compound 125 and first precursor 110, a byproduct 130-*c* will be formed. After forming the second instance of first compound 115, the byproduct 130-*c* and/or at least a portion of the first precursor 110 may be purged (e.g., removed from the reactor) at 102-*c* before returning back to stage 101-*b*. In some examples, the temperature of the reactor may be set or adjusted to the first predefined value or a third predefined value such that the first compound 115 forms on the surface of the base material 105. In some examples, first precursor 110 and second precursor 120 may be delivered to the reactor (e.g., or reactors) using an inert gas (e.g., argon, helium, nitrogen). Additionally or alternatively, the byproducts 130-*a*, 130-*b* and/or 130-*c* may be purged using an inert gas (e.g., argon, helium, nitrogen).

In some examples, the process may be repeated to deposit multiple layers of the second compound 125. For instance, after depositing a first instance of second compound 125, the first instance of the second compound 125 may be exposed to the first precursor 110 to form a second instance of the first compound 115 on a surface of the first instance of the second compound 125. Then, the second instance of the first compound 115 may be exposed to the second precursor 120 to form a second instance of the second compound 125 on the surface of the first instance of the second compound 125.

In some examples, the first precursor 110 and the first compound 115 may include a Group XIII, Group XIV, or Group XV element (e.g., germanium, arsenic, tin). Additionally, the second precursor 120 may include at least one of germanium, tin, or silicon. For instance, the second precursor 120 may have the chemical formula B-C(1)-D(1), or B-C(1)-C(1)-D(1), or B-C(2)-D(1)D(2), or BD(3)-C(2)-C(2)-D(1)D(2), or B-C(3)-D(1)D(2)D(3), or BD(4)D(5)-C(3)-C(3)-D(1)D(2)D(3), where B is a first moiety and D(1), D(2), D(3), D(4) and D(5) are additional moieties, and where each of B and D(1), D(2), D(3), D(4) and D(5) independently include at least one of germanium, tin, or silicon. In some examples, C(1) may be one of tellurium, sulfur, or selenium. In some examples, C(2), may be one of antimony, arsenic, phosphorous. In some examples, C(3) may be one of silicon, germanium, or tin.

In some examples, the base material 105 may be a structure on a substrate (e.g., a wafer). In some such examples, the base material 105 may span in a first direction and a second direction, where the first direction is orthogonal to the second direction. Additionally, a memory device including the base material 105 may include word lines extending along the first direction and/or the second direction and bit lines extending along a third direction orthogonal to the first direction and the second direction. In some such examples, a stack of materials (e.g., a sequence of materials) may be formed in one or more recesses of the word lines, where the stack may extend along the first direction and/or the second direction and where the sequence of materials may include a memory cell (e.g., a chalcogenide element). In some examples, the techniques described herein may be used to form a compound on the base material 105, the word lines, the bit lines, the stacks, or any combination thereof.

Figure 2:
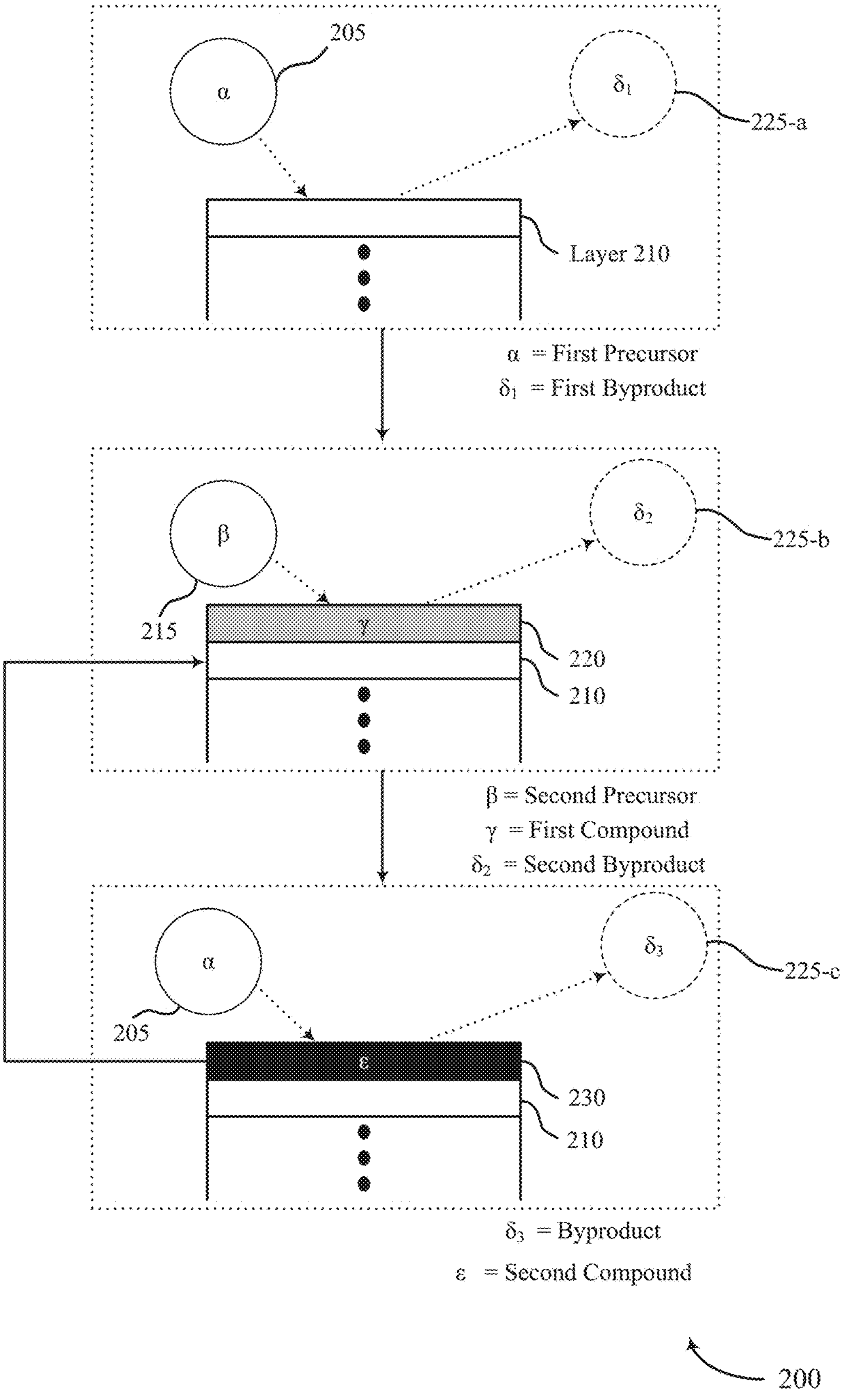
FIG. 2 illustrates an example of a material deposition process that supports atomic layer deposition using tin-based or germanium-based precursors in accordance with examples as disclosed herein.

FIG. 2 illustrates an example of a material deposition process 200 that supports atomic layer deposition using tin-based or germanium-based precursors in accordance with examples as disclosed herein.

As illustrated in FIG. 2, a layer 210 may be exposed to a first precursor 205. The first precursor, for instance, include at least one of a Group XIII, Group XIV, or Group XV element. In some examples, the first precursor 205 reacting with the layer 210 may form a byproduct 225-*a*, which may be removed from the reactor. After forming the first compound 220, the first compound 220 may be exposed to a second precursor 215, where the second precursor may include at least one of germanium, tin, silicon, tellurium, sulfur, antimony, arsenic, phosphorous, or selenium. The second precursor 215 may react with the first compound 220 to form second compound 230. In some examples, the second precursor 215 may form a layer on the first compound 220 and the layer may react with the first compound 220 to form the second compound 230. In other examples, the second precursor 215 may directly react with the first compound 220 to form the second compound 230. This reaction may produce a byproduct 225, which may be removed from the reactor.

In some examples, the second compound 230 may be exposed to a first precursor 205 to form a second instance of the first compound on the second compound 230. In some examples, the first precursor may form a layer on the second compound 230 and the layer may react with the second compound 230 to form the second instance of the first compound. In other examples, the first precursor 205 may directly react with the second compound 230 to form the second instance of the first compound. This reaction may produce a byproduct 225-*c*, which may be removed from the reactor. Without deviating from the scope of the disclosure, the second instance of the first compound may instead be a third compound distinct from the first compound. In some examples, the process may be repeated to deposit multiple layers of the second compound 230. For instance the process may repeat again where the second instance of the first compound acts as depicted first compound 220 and second compound 230 acts as layer 210. In some examples, first precursor 205 and second precursor 215 may be delivered to the reactor (e.g., or reactors) using an inert gas (e.g., argon, helium, nitrogen). Additionally or alternatively, the byproducts 225-*a*, 225-*b*, and/or 225-*c* may be purged using an inert gas (e.g., argon, helium, nitrogen).

In some examples, the first precursor 205 may include at least one of a Group XIII, Group XIV, or Group XV element. Examples of Group XIII elements may include boron, aluminum, gallium, indium, and thallium. Examples of Group XIV elements may include carbon, silicon, germanium, tin, and lead Examples of Group XV elements may include nitrogen, phosphorous, arsenic, antimony, and bismuth. Examples of the first precursor may include $Ge(OEt)_4$, where "Ge" may correspond to germanium, "O" may correspond to oxygen, and "Et" may correspond to ethyl. Another example of the first precursor may be $As(OEt)_3$, where "As" may correspond to arsenic, "O" may correspond to oxygen, and "Et" may correspond to ethyl. Another example of the first precursor may be $SbCl_3$, where "Sb" may correspond to antimony and "Cl" may correspond to chlorine. Another example of the first precursor may be $GeCl_4$, where "Ge" may correspond to germanium and "Cl" may correspond to chlorine.

In some examples, C(1) may be tellurium, sulfur, or selenium and B may be defined by the chemical formula $R_1R_2R_3A$, where A is at least one of germanium, tin, or silicon and D(1) may be defined by the chemical formula $XR_4R_5R_6$, where X is at least one of germanium, tin, or silicon and each of $R_1$, $R_2$, $R_3$, $R_4$, $R_5$, or $R_6$ may be independently selected from hydrogen (or deuterium), an alkyl group, an aryl group, an alkoxy, an alkyl-sulfide, an alkyl-selenide, a halide, or an alkyl-telluride. Additionally or alternatively, each of $R_1$, $R_2$, $R_3$, $R_4$, $R_5$, or $R_6$ may be independently selected from a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, an isofulminate; an amide including two substituents, which may be chosen among an alkyl substituent, a silyl substituent (e.g., the silyl group having hydrogen, deuterium, or alkyl substituents), or a germyl substituent (e.g., the germyl group having hydrogen, deuterium, or alkyl substituents); or an hydrazide including three substituents, which may be chosen among an alkyl substituent, a silyl substituent (e.g., the silyl group having hydrogen, deuterium, or alkyl substituents), or a germyl substituent (e.g., the germyl group having hydrogen, deuterium, or alkyl substituents). Additionally or alternatively, each of $R_1$, $R_2$, $R_3$, $R_4$, $R_5$, or $R_6$ may be independently selected from a $-SiR_aR_bR_c$ moiety, a $-GeR_aR_bR_c$ moiety, a $-SnR_aR_bR_c$ moiety, a $-SiR_aR_bCR_cR_dR_e$ moiety, a $-CR_aR_bSiR_cR_dR_e$ moiety, a $-SiR_aR_bGeR_cR_dR_e$ moiety, or more generally a moiety containing a set of carbon atoms, silicon atoms, germanium atoms, tin atoms, or any combination thereof. For instance, each atom of the set of carbon atoms, silicon atoms, germanium atoms, tin atoms, or any combination thereof is fully saturated with respective substituents so that each of these (carbon, silicon, germanium, or tin) atoms has 4 bonds, which can either be to other (carbon, silicon, germanium, or tin) atoms of the set or to corresponding substituents represented as $R_a$ through $R_x$ (where the substituents may be indexed as a, b, c . . . , x, where x is some index different than a). In some such examples, up to 10 atoms of Carbon, Silicon, Germanium, or Tin may be included in the set that are distinct from any atoms of Carbon, Silicon, Germanium, or Tin of the $R_a$ through $R_x$ substituents. Additionally, the set of carbon atoms, silicon atoms, germanium atoms, tin atoms, or any combination thereof may be linear, branched, or cyclic. In some examples, $R_a$ through $R_x$ may be independently selected from hydrogen (or deuterium), an alkyl group, an aryl group, an alkoxy, an alkyl-sulfide, an alkyl-selenide, a halide, an alkyl-telluride, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, an isofulminate, an amide including two substituents, which may be chosen among an alkyl substituent, a silyl substituent (e.g., the silyl group having hydrogen, deuterium, or alkyl substituents), or a germyl substituent (e.g., the germyl group having hydrogen, deuterium, or alkyl substituents), or an hydrazide including three substituents, which may be chosen among an alkyl substituent, a silyl substituent (e.g., the silyl group having hydrogen, deuterium, or alkyl substituents), or a germyl substituent (e.g., the germyl group having hydrogen, deuterium, or alkyl substituents). In some examples, each of $R_1$, $R_2$, $R_3$, $R_4$, $R_5$, and $R_6$ are the same element or the same compound. In examples in which B is defined by the chemical formula $R_1R_2R_3A$, and in which D(1) is defined by the chemical formula $XR_4R_5R_6$, where each of A and X is at least one of germanium, tin, or silicon the second precursor 215 may have the following form:

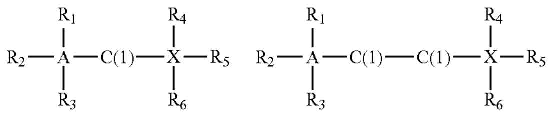

In some examples, C(2) may be arsenic, phosphorus or antimony, and B may be defined by the chemical formula $R_1R_2R_3A$, where A is at least one of germanium, tin, or silicon and D(1), D(2), and D(3), may be defined by the chemical formula $X_1R_4R_5R_6$, $X_2R_7R_8R_9$, $X_3R_{10}R_{11}R_{12}$, where each of $X_1$, $X_2$, and $X_3$ is at least one of germanium, tin, or silicon and each of $R_1$, $R_2$, $R_3$, $R_4$, $R_5$, $R_6$, $R_7$, $R_8$, $R_9$, $R_{10}$, $R_{11}$, or $R_{12}$ may be independently selected from hydrogen (or deuterium), an alkyl group, an aryl group, an alkoxy, an alkyl-sulfide, an alkyl-selenide, a halide, or an alkyl-telluride. Additionally or alternatively, each of $R_1$, $R_2$, $R_3$, $R_4$, $R_5$, $R_6$, $R_7$, $R_8$, $R_9$, $R_{10}$, $R_{11}$, or $R_{12}$ may be independently selected from a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, an isofulminate, an amide including two substituents, which may be chosen among an alkyl substituent, a silyl substituent (e.g., the silyl group having hydrogen, deuterium, or alkyl substituents), or a germyl substituent (e.g., the germyl group having hydrogen, deuterium, or alkyl substituents), or an hydrazide including three substituents, which may be chosen among an alkyl substituent, a silyl substituent (e.g., the silyl group having hydrogen, deuterium, or alkyl substituents), or a germyl substituent (e.g., the germyl group having hydrogen, deuterium, or alkyl substituents). Additionally or alternatively, each of $R_1$, $R_2$, $R_3$, $R_4$, $R_5$, $R_6$, $R_7$, $R_8$, $R_9$, $R_{10}$, $R_{11}$, or $R_{12}$ may be independently selected from a $-SiR_aR_bR_c$ moiety, a $-GeR_aR_bR_c$ moiety, a $-SnR_aR_bR_e$ moiety, a $-SiR_aR_bCR_cR_dR_e$ moiety, a $-CR_aR_bSiR_cR_dR_e$ moiety, a $-SiR_aR_bGeR_cR_dR_e$ moiety, or more generally a moiety containing a set of carbon atoms, silicon atoms, germanium atoms, tin atoms, or any combination thereof. For instance, each atom of the set of carbon atoms, silicon atoms, germanium atoms, tin atoms, or any combination thereof is fully saturated with respective substituents so that each of these (carbon, silicon, germanium, or tin) atoms has 4 bonds, which can either be to other (carbon, silicon, germanium, or tin) atoms of the set or to corresponding substituents represented as $R_a$ through $R_x$ (where the substituents may be indexed as a, b, c . . . , x, where x is some index different than a). In some such examples, up to 10 atoms of Carbon, Silicon, Germanium, or Tin may be included in the set that are distinct from any atoms of Carbon, Silicon, Germanium, or Tin of the $R_a$ through $R_x$ substituents. Additionally, the set of carbon atoms, silicon atoms, germanium atoms, tin atoms, or any combination thereof may be linear, branched, or cyclic. In some examples, $R_a$ through $R_x$ may be independently selected from hydrogen (or deuterium), an alkyl group, an aryl group, an alkoxy, an alkyl-sulfide, an alkyl-selenide, a halide, an alkyl-telluride, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, an isofulminate, an amide including two substituents, which may be chosen among an alkyl substituent, a silyl substituent (e.g., the silyl group having hydrogen, deuterium, or alkyl substituents), or a germyl substituent (e.g., the germyl group having hydrogen, deuterium, or alkyl substituents), or an hydrazide including three substituents, which may be chosen among an alkyl substituent, a silyl substituent (e.g., the silyl group having hydrogen, deuterium, or alkyl substituents), or a germyl substituent (e.g., the germyl group having hydrogen, deuterium, or alkyl substituents). In some examples, each of $R_1$, $R_2$, $R_3$, $R_4$, $R_5$, $R_6$, $R_7$, $R_8$, $R_9$, $R_{10}$, $R_{11}$, and $R_{12}$ are the same element or the same compound. In examples in which B is defined by the chemical formula $R_1R_2R_3A$, and in which D(1), D(2), and D(3) are defined by the chemical formula $X_1R_4R_5R_6$, $X_2R_7R_8R_9$, $X_3R_{10}R_{11}R_{12}$, where each of A, $X_1$, $X_2$, $X_3$ is at least one of germanium, tin, or silicon the second precursor 215 may have the following form:

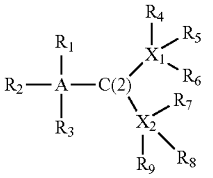 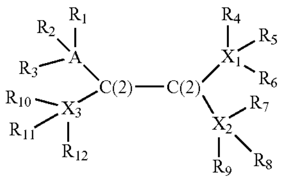

In some examples, C(3) may be germanium or tin, and B may be defined by the chemical formula $R_1R_2R_3A$, where A is at least one of germanium, tin, or silicon and D(1), D(2), D(3), D(4), and D(5), may be defined by the chemical formula $X_1R_4R_5R_6$, $X_2R_7R_8R_9$, $X_3R_{10}R_{11}R_{12}$, $X_4R_{13}R_{14}R_{15}$, $X_5R_{16}R_{17}R_{18}$, where each of $X_1$, $X_2$, $X_3$, $X_4$, and $X_5$ is at least one of germanium, tin, or silicon and each of $R_1$, $R_2$, $R_3$, $R_4$, $R_5$, $R_6$, $R_7$, $R_8$, $R_9$, $R_{10}$, $R_{11}$, $R_{12}$, $R_{13}$, $R_{14}$, $R_{15}$, $R_{16}$, $R_{17}$, or $R_{18}$ may be independently selected from hydrogen (or deuterium), an alkyl group, an aryl group, an alkoxy, an alkyl-sulfide, an alkyl-selenide, a halide, an alkyl-telluride, an amide including two substituents, which may be chosen among an alkyl substituent, a silyl substituent (e.g., the silyl group having hydrogen, deuterium, or alkyl substituents), or a germyl substituent (e.g., the germyl group having hydrogen, deuterium, or alkyl substituents), or an hydrazide including three substituents, which may be chosen among an alkyl substituent, a silyl substituent (e.g., the silyl group having hydrogen, deuterium, or alkyl substituents), or a germyl substituent (e.g., the germyl group having hydrogen, deuterium, or alkyl substituents). Additionally or alternatively, each of $R_1$, $R_2$, $R_3$, $R_4$, $R_5$, $R_6$, $R_7$, $R_8$, $R_9$, $R_{10}$, $R_{11}$, $R_{12}$, $R_{13}$, $R_{14}$, $R_{15}$, $R_{16}$, $R_{17}$, or $R_{18}$ may be independently selected from a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate. Additionally or alternatively, each of $R_1$, $R_2$, $R_3$, $R_4$, $R_5$, $R_6$, $R_7$, $R_8$, $R_9$, $R_{10}$, $R_{11}$, $R_{12}$, $R_{13}$, $R_{14}$, $R_{18}$, $R_{16}$, $R_{17}$, or $R_{18}$ may be independently selected from a $-SiR_aR_bR_c$ moiety, a $-GeR_aR_bR_c$ moiety, a $-SnR_aR_bR_c$ moiety, a $-SiR_aR_bCR_cR_dR_e$ moiety, a $-CR_aR_bSiR_cR_dR_e$ moiety, a $-SiR_aR_bGeR_cR_dR_e$ moiety, or more generally a moiety containing a set of carbon atoms, silicon atoms, germanium atoms, tin atoms, or any combination thereof. For instance, each atom of the set of carbon atoms, silicon atoms, germanium atoms, tin atoms, or any combination thereof is fully saturated with respective substituents so that each of these (carbon, silicon, germanium, or tin) atoms has 4 bonds, which can either be to other (carbon, silicon, germanium, or tin) atoms of the set or to corresponding substituents represented as $R_a$ through $R_x$ (where the substituents may be indexed as a, b, c . . . , x, where x is some index different than a). In some such examples, up to 10 atoms of Carbon, Silicon, Germanium, or Tin may be included in the set that are distinct from any atoms of Carbon, Silicon, Germanium, or Tin of the $R_a$ through $R_x$ substituents. Additionally, the set of carbon atoms, silicon atoms, germanium atoms, tin atoms, or any combination thereof may be linear, branched, or cyclic. In some examples, $R_a$ through $R_x$ may be independently selected from hydrogen (or deuterium), an alkyl group, an aryl group, an alkoxy, an alkyl-sulfide, an alkyl-selenide, a halide, an alkyl-telluride, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, an isofulminate, an amide including two substituents, which may be chosen among an alkyl substituent, a silyl substituent (e.g., the silyl group having hydrogen, deuterium, or alkyl substituents), or a germyl substituent (e.g., the germyl group having hydrogen, deuterium, or alkyl substituents), or an hydrazide including three substituents, which may be chosen among an alkyl substituent, a silyl substituent (e.g., the silyl group having hydrogen, deuterium, or alkyl substituents), or a germyl substituent (e.g., the germyl group having hydrogen, deuterium, or alkyl substituents). In some examples, each of $R_1$, $R_2$, $R_3$, $R_4$, $R_5$, $R_6$, $R_7$, $R_8$, $R_9$, $R_{10}$, $R_{11}$, $R_{12}$, $R_{13}$, $R_{14}$, $R_{15}$, $R_{16}$, $R_{17}$, and $R_{18}$ are the same element or the same compound. In examples in which B is defined by the chemical formula $R_1R_2R_3A$, and in which D(1), D(2), D(3), D(4), and D(5) are defined by the chemical formula $X_1R_4R_5R_6$, $X_2R_7R_8R_9$, $X_3R_{10}R_{11}R_{12}$, $X_4R_{13}R_{14}R_{15}$, $X_5R_{16}R_{17}R_{18}$, where each of A, $X_1$, $X_2$, $X_3$, $X_4$, $X_5$ is at least one of germanium, tin, or silicon the second precursor 215 may have the following form:

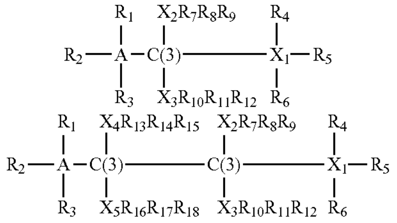

In one example, the first precursor 205 may have the chemical formula $Ge(OEt)_4$ and the second precursor 215 may have the chemical formula $R_1R_2R_3A$-Se—$ZR_4R_5R_6$, where "Ge" may refer to germanium, "O" may refer to oxygen, "Et" may refer to ethyl, and "Se" may refer to selenium. In some such examples, the second compound 230 may be $GeSe_2$ and the byproducts 225 may be EtO-$AR_1R_2R_3$ and EtO-$ZR_4R_5R_6$. Such a reaction may be represented by the formula 2 $R_1R_2R_3A$-Se—$ZR_4R_5R_6$+Ge$(OEt)_4$ à $GeSe_2$ (deposited)+2 EtO-$AR_1R_2R_3$ (volatile)+2 EtO-$ZR_4R_5R_6$ (volatile).

In another example, the first precursor 205 may have the chemical formula $As(OEt)_3$ and the second precursor 215 may have the chemical formula $R_1R_2R_3A$-Se—$XR_4R_5R_6$, where "As" may refer to germanium, "O" may refer to oxygen, "Et" may refer to ethyl, and "Se" may refer to selenium. In some such examples, the second compound 230 may be $As_2Se_3$ and the byproducts 225 may be EtO-$AR_1R_2R_3$ and EtO-$XR_4R_5R_6$. Such a reaction may be represented by the formula 3 $R_1R_2R_3A$-Se—$XR_4R_5R_6$+2 $As(OEt)_3$ à $As_2Se_3$ (deposited)+3 EtO-$AR_1R_2R_3$ (volatile)+3 EtO-$XR_4R_5R_6$ (volatile).

In another example, the first precursor 205 may have the chemical formula $SbCl_3$ and the second precursor 215 may have the chemical formula $R_1R_2R_3A$-Sb—$(X_1R_4R_5R_6)(X_2R_7R_8R_9)$, where "Sb" may refer to antimony and "Cl" may refer to chlorine. In some such examples, the second compound 230 may be Sb and the byproducts 225 may be Cl-$AR_1R_2R_3$, Cl—$X_1R_4R_5R_6$, and Cl—$X_2R_7R_8R_9$. Such a reaction may be represented by the formula $R_1R_2R_3A$-Sb—$(X_1R_4R_5R_6)(X_2R_7R_8R_9)$+$SbCl_3$ à 2Sb (deposited)+Cl-$AR_1R_2R_3$ (volatile)+Cl—$X_1R_4R_5R_6$ (volatile)+Cl—$X_2R_7R_8R_9$ (volatile).

In another example, the first precursor 205 may have the chemical formula $Cl_3Ge$—$GeCl_3$ and the second precursor 215 may have the chemical formula $R_1R_2R_3A$-Se—$(XR_4R_5R_6)$, where "Se" may refer to selenium and "Cl" may refer to chlorine. In some such examples, the second compound 230 may be $Ge_2Se_3$ and the byproducts 225 may be Cl-$AR_1R_2R_3$, and Cl—$XR_4R_5R_6$. Such a reaction may be represented by the formula 3 $R_1R_2R_3A$-Se—$(XR_4R_5R_6)$+2 $Cl_3Ge$—$GeCl_3$ à 2 $Ge_2Se_3$ (deposited)+3 Cl-$AR_1R_2R_3$ (volatile)+3 Cl—$XR_4R_5R_6$ (volatile).

In another example, the first precursor 205 may be a Germanium(II) amidinate (or any other Germanium(II) compound) with chemical formula $Ge(AMD)_2$ and the second precursor 215 may have the chemical formula $R_1R_2R_3A$-Se—$(XR_4R_5R_6)$, where "Se" may refer to selenium and "AMD" may refer to an amidinate ligand. In some such examples, the second compound 230 may be GeSe and the byproducts 225 may be AMD-$AR_1R_2R_3$, AMD-$XR_4R_5R_6$. Such a reaction may be represented by the formula $R_1R_2R_3A$-Se—$(XR_4R_5R_6)$+$Ge(AMD)_2$ à GeSe (deposited)+AMD-$AR_1R_2R_3$ (volatile)+AMD-$XR_4R_5R_6$ (volatile).

In another example, the first precursor 205 may have the chemical formula $GeCl_4$ and the second precursor 215 may have the chemical formula $R_1R_2R_3A$-Ge—$(X_1R_4R_5R_6)(X_2R_7R_8R_9)(X_3R_{10}R_{11}R_{12})$, where "Ge" may refer to germanium and "Cl" may refer to chlorine. In some such examples, the second compound 230 may be Ge and the byproducts 225 may be Cl-$AR_1R_2R_3$, Cl—$X_1R_4R_5R_6$, Cl—$X_2R_7R_8R_9$, and Cl—$X_3R_{10}R_{11}R_{12}$. Such a reaction may be represented by the formula $R_1R_2R_3A$-Ge—$(X_1R_4R_5R_6)(X_2R_7R_8R_9)(X_3R_{10}R_{11}R_{12})$+$GeCl_4$ à 2Ge (deposited)+Cl-$AR_1R_2R_3$ (volatile)+Cl-$X_1R_4R_5R_6$ (volatile)+Cl-$X_2R_7R_8R_9$ (volatile)+Cl-$X_3R_{10}R_{11}R_{12}$ (volatile).

In some examples, the term 'alkyl' may refer to a saturated hydrocarbon chain, an unsaturated hydrocarbon chain, a linear hydrocarbon chain, a branched hydrocarbon chain, or a cyclic hydrocarbon chain including from one carbon atom (e.g., $C_1$) to ten carbon atoms (e.g., $C_{10}$).

In some examples, a "methyl" may refer to a compound with the chemical formula $CH_3$, where "C" may refer to carbon and "H" may refer to hydrogen. In some examples, an "ethyl" may refer to a compound with the chemical formula $CH_2CH_3$, In some examples, a "propyl" may refer to a compound with the chemical formula $CH_2CH_2CH_3$. In some examples, an "isopropyl" may refer to a compound with the chemical formula $CH(CH_3)_2$. In some examples, an alkyl group may refer to a compound with a chemical formula $C_nH_{2n+1}$, where n is an integer greater than or equal to 1. In some examples, a sulfide may refer to an inorganic anion of sulfur, a selenide may refer to an inorganic anion of selenium, and a telluride may refer to an inorganic anion of tellurium. In some examples, a dialkylamide may refer to an amide group with two alkyl groups.

In some examples, a methoxy may refer to a methyl group bonded with an oxygen. In some examples, an ethoxy may refer to an ethyl group bonded with an oxygen. A dimethylamino may be a moiety with chemical formula $N(CH_3)_2$, where "C" may refer to carbon, "H" may refer to hydrogen, and "N" may refer to nitrogen. In some examples, a diethylamino may be a moiety with chemical formula $N(CH_2CH_3)_2$. In some examples, ethylmethylamino may be a moiety with chemical formula $N(CH_2CH_3)(CH_3)$.

In some examples, an alkyl group may refer to a compound with a chemical formula $C_nH_{(2n+1)}$ where n is an integer greater than or equal to 1. In some examples, an alkyl-sulfide may refer to a —SR moiety, where R is an alkyl group, an alkyl-selenide may refer to a —SeR moiety, where R is an alkyl group, an alkyl-telluride may refer to a —TeR moiety, where R is an alkyl group. In some examples, a dialkylamide may refer to an amide moeity with two alkyl groups, such as —NR'R", where R' and R" are alkyl groups.

In some examples, the methods or aspects of the methods described herein may be performed using chemical vapor deposition (CVD). For instance, the first precursor 205 may be deposited using CVD and the second precursor may react with the first compound 220 via the methods described herein, the first compound 220 may be formed with the first precursor 205 via the methods described herein and the second precursor 215 may be deposited onto the first compound 220 using CVD, or the first precursor 205 and the second precursor 215 may both be deposited using CVD.

Independently including or selecting from a set of elements and/or compound may refer to a capability that a first element or compound may be substituted for another while still producing a precursor usable for forming a compound on a surface of a material It should be noted that there may be examples in which the second precursor 215 may react with the layer 210 to form a third compound. In some such examples, the first precursor 205 may react with the third compound to form a fourth compound. The process may be repeated and such that multiple layers of a selenide-based film, a tellurium-based film, a sulfur-based film, an antimony-based film, an arsenic-based film, a phosphorous-based film, a germanium-based film, a tin-based film, or any combination thereof may form.

While the second compound 230 may be formed by sequentially introducing and reacting the first precursor 205 and the second precursor 215 (i.e., in an ABAB . . . sequence), the precursors may be introduced in a different order than that described above (e.g., in a BABA . . . sequence, an AABAAB . . . sequence, an ABBABB sequence) depending on the composition of the second compound 230. For instance, first precursor 205 may be introduced followed by the introduction of the second precursor 215. Depending on the composition of the second compound 230, more than one introduction (e.g., pulse) of the first precursor 205 or the second precursor 215 may be conducted before the second precursor 215 or the first precursor 205, respectively, are introduced.

In some examples, a first molecule for the first precursor 205 (i.e., precursor 1-*a*) and a second molecule for the second precursor 215 (i.e., precursor 2-*a*) may be introduced repeatedly for one or more cycles (e.g., AA times or AA cycles, where AA is some positive integer). After repeatedly introducing precursor 1-*a* and precursor 2-*a* over the multiple cycles, a third molecule for the first precursor 205 (i.e., precursor 1-*b*) and a fourth molecule for the second precursor (i.e., precursor 2-*b*) may be introduced repeatedly for one or more cycles (e.g., BB times or BB cycles, where BB is some positive integer). This process may continue for multiple other precursors up to a predefined amount (e.g., CC times or CC cycles for precursors 1-*c* and 2-*c*, DD times or DD cycles for precursors 1-*d* and 2-*d*, and so on, up to XX times or XX cycles for precursors 1-*x* and 2-*x*, where CC, DD, and XX are all positive integers). After this process continues up to the predefined amount, the process may repeat (e.g., precursors 1-*a* and 2-*a* may be used again for AA times or AA cycles). It should be noted that each of the molecules used as precursors for each cycle may be selected from the same molecule relative to a different cycle or different molecules from the molecules described herein for first precursor 205 and second precursor 215.

In some such examples, a third precursor may be reacted with a layer of second compound 230 to form another compound on the layer of second compound 230. Additionally, a fourth precursor may be reacted with the other compound to form a second layer of material on the layer of second compound 230. In some such examples, a set of X precursor pairs may be identified, where each precursor pair of the set of X precursor pairs includes one of a first set of precursors and one of a second set of precursors, where each precursor pair has an associated quantity of cycles, where X is an integer greater than or equal to 2, where each precursor of the second set of precursors has the form given by chemical formula B-C(1)-D(1), B-C(1)-C(1)-D(1), B-C(2)-D(1)D(2), BD(3)-C(2)-C(2)-D(1)D(2), B-C(3)-D(1)D(2)D(3), or BD(4)D(5)-C(3)-C(3)-D(1)D(2)D(3), where each of B, D(1), D(2), D(3), D(4), and D(5) are a respective moiety that independently includes at least one of germanium, tin, or silicon, and where C(1) includes tellurium, sulfur, or selenium, where C(2) includes antimony, arsenic, and phosphorous, and where C(3) includes silicon, germanium, or tin. Notably, the moieties represented by B, D(1), D(2), D(3), D(4), D(5), or any combination may be different for different precursors of the second set of precursors and the elements that C(1), C(2), and C(3) includes may be different for different precursors of the second set of precursors. Additionally, according to the associated quantity of cycles for each precursor pair of the set of X precursor pairs and to form a respective film associated with the precursor pair, a reacting of the one of the first set of precursors to form a respective compound and a reacting of the one of the second set of precursors with the respective compound to form one or more layers of may be performed.

The methods described herein may have one or more advantages. For instance, using germanium and/or tin in the first precursor 205 may enable reactions (e.g., the formation of first compound 220 and/or the formation of second compound 230) to occur at lower temperatures as compared to precursors that do not include germanium and/or tin (e.g., trimethylsilyl precursors). Additionally or alternatively, using germanium and/or tin in the first precursor 205 may enable deposition that occurs more quickly for a given temperature as compared to precursors that do not include germanium and/or tin.

Figure 3:
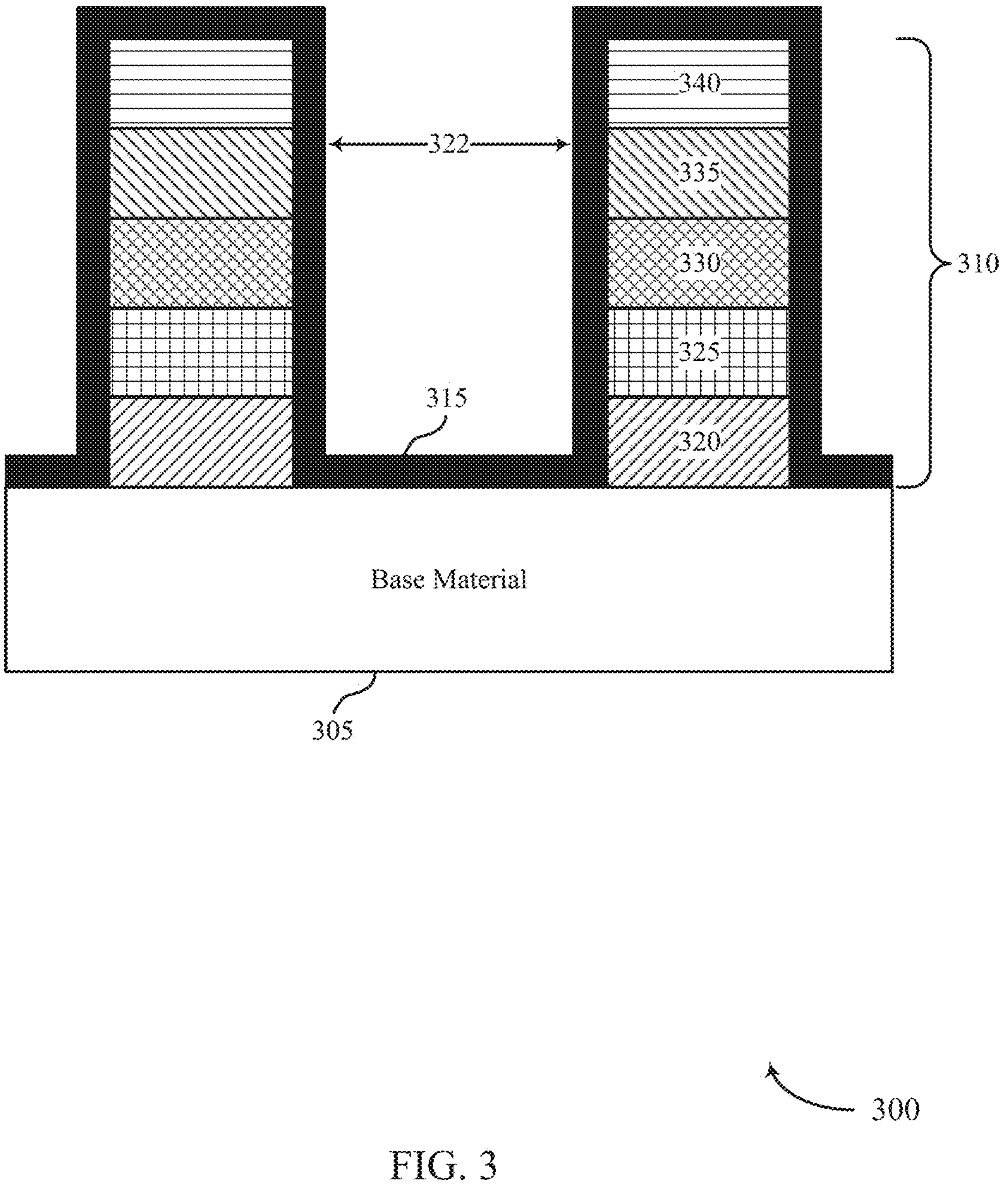
FIG. 3 illustrates an example of an electronic device that supports atomic layer deposition using tin-based or germanium-based precursors in accordance with examples as disclosed herein.

FIG. 3 illustrates an example of an electronic device 300 that supports atomic layer deposition using tin-based or germanium-based precursors in accordance with examples as disclosed herein. The electronic device 300 may include a base material 305 with one or more features 310 (e.g., pillars, stacks), where the base material 305 and the one or more features 310 may be covered in a material 315. Each feature 310 may include materials 320, 325, 330, 335, and 340, where each of material 320, 325, 330, 335, and 340 may be an example of a chalcogenide material, an organic (e.g., carbon) material, a carbon allotrope (e.g., graphite), a reactive metal (e.g., tungsten, aluminum, or tantalum), a thermally-sensitive material, an oxidation-sensitive material, or any combination thereof. Some of material 320, 325, 330, 335, and 340 may be examples of other materials. In some examples, base material 305 or the combination of base material 305 and one or more features 310 may be an example of a base material 105 as described with reference to FIG. 1 or a layer 210 as described with reference to FIG. 2. Additionally or alternatively, material 315 may be an example of a second compound 125 as described with reference to FIG. 1 or a second compound 20 as described with reference to FIG. 2.

While FIG. 3 illustrates feature 310 including five materials, each feature may be made up of a single material, two or more materials, or five materials. The features may be separated from each other by openings 322. The materials of the features 310 may be formed adjacent to (e.g., over) the base material 305 using techniques such as photolithography, physical vapor deposition (PVD), chemical vapor deposition (CVD), or ALD. In some examples, the base material 305 may include one or more materials, layers, structures, or regions thereon. The features 310 may be considered high aspect ratio (HAR) features, where HAR may for instance correspond to greater than or equal to an aspect ratio of 10:1, greater than or equal to an aspect ratio of 20:1, greater than or equal to an aspect ratio of 25:1, or greater than or equal to an aspect ratio of 50:1. In some examples, the material 315 may be formed on one of but not both base material 305 and the one or more features 310. Additionally or alternatively, the material 315 may be formed as a material within each of the one or more features 310. Additionally or alternatively, the material 315 may be formed on a planar material or on a low aspect ratio features of an electronic device.

The material 315 may be formed over the features 310 according to the aspects described herein. For instance, the material 315 may be formed by sequentially exposing the features 310 of the electronic device 300 to a first precursor (e.g., first precursor 205) and a second precursor (e.g., second precursor 215) as described herein. The material 315 may function as a conductive component of electronic device 300, such as a transistor, a capacitor, an electrode, an etch-stop material, a gate, a barrier material, or a spacer material. One or more materials and/or structure, such as a gate, may subsequently be formed in the openings 322 by techniques such as photolithography, PVD, CVD, or ALD and/or additional process acts conducted to form a complete electronic device containing electronic device 300.

The material 315 may be conformally formed on the features 310 according to the aspects described herein. For instance, the thickness of material 315 on sidewalls of the features 310 may be substantially uniform. For instance, the material 315 may be formed to a thickness ranging from a monolayer to 100 nm. Alternatively, the material 315 may be formed at a greater thickness. The material 315 may be in direct contact with each material of the features 310 or some materials of the features 310. Additionally or alternatively, the material 315 may be in contact with the base material 305.

In some examples, the base material 305 may be a structure on a substrate (e.g., a wafer). In some such examples, the base material 305 may span in a first direction and a second direction, where the first direction is orthogonal to the second direction. Additionally, a memory device including the base material 305 may include word lines extending along the first direction and/or the second direction and bit lines extending along a third direction orthogonal to the first direction and the second direction. In some such examples, a stack of materials (e.g., a sequence of materials, such as a stack 310) may be formed in one or more recesses of the word lines, where the stack may extend along the first direction and/or the second direction and where the sequence of materials may include a memory cell (e.g., a chalcogenide element). In some examples, the stacks may each be coupled with one word line and one bit line. In some examples, the techniques described herein may be used to form layers of carbon on the base material 305, the word lines, the bit lines, the stacks, or any combination thereof.

Figure 4:
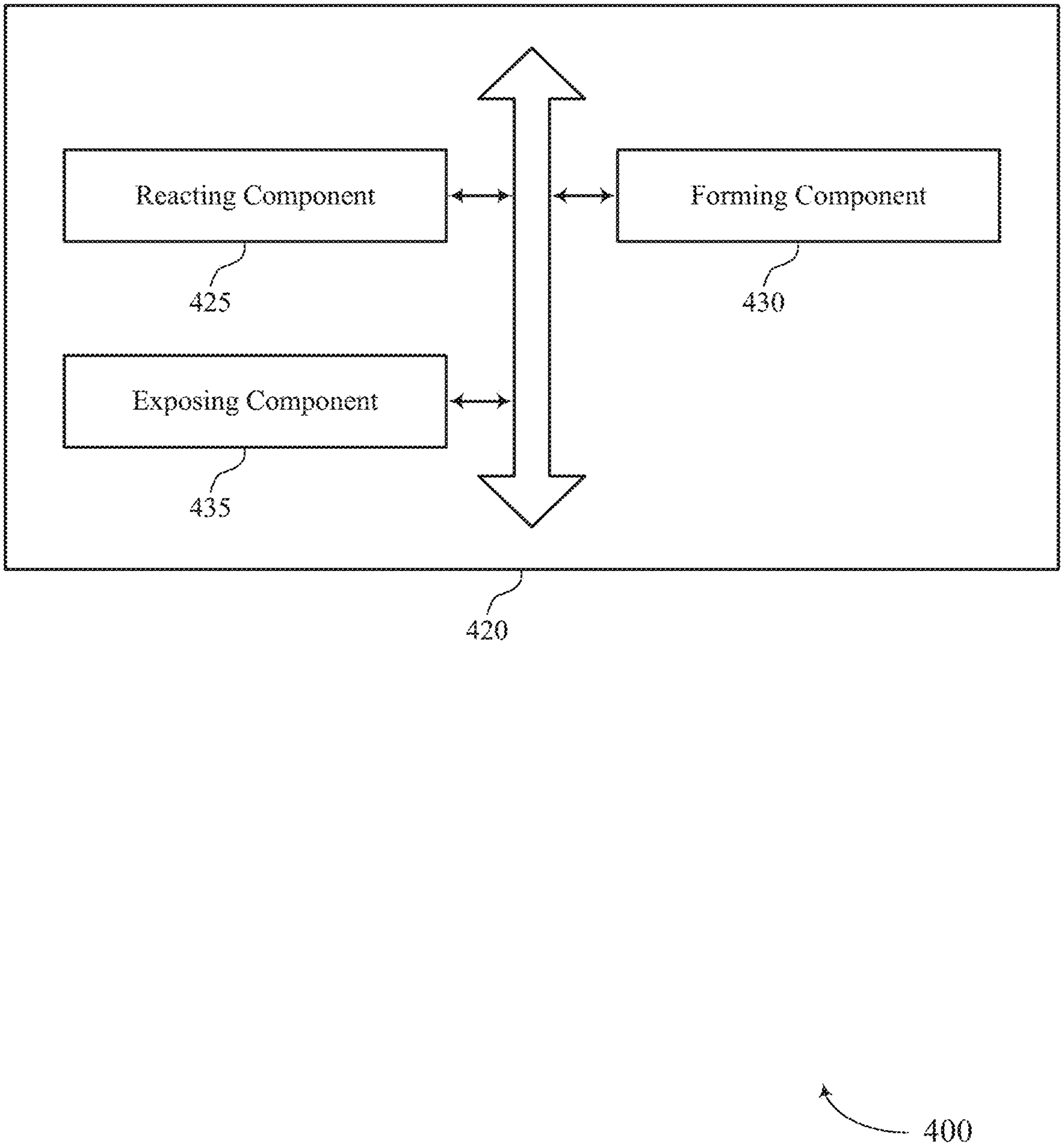
FIG. 4 shows a block diagram of a controller that supports atomic layer deposition using tin-based or germanium-based precursors in accordance with examples as disclosed herein.

FIG. 4 shows a block diagram 400 of a controller 420 that supports atomic layer deposition using tin-based or germanium-based precursors in accordance with examples as disclosed herein. The controller 420 may be an example of aspects of a controller as described with reference to FIGS. 1 through 3. The controller 420, or various components thereof, may be an example of means for performing various aspects of atomic layer deposition using tin-based or germanium-based precursors as described herein. For example, the controller 420 may include a reacting component 425, a forming component 430, an exposing component 435, or any combination thereof. Each of these components may communicate, directly or indirectly, with one another (e.g., via one or more buses).

The reacting component 425 may be configured as or otherwise support a means for reacting a first precursor with a base material to form a first compound including a first element on the base material, where the first compound includes at least one of a Group XIII, Group XIV, or Group XV element. In some examples, the reacting component 425 may be configured as or otherwise support a means for reacting a second precursor with the first compound to form a second compound on the base material, where the second precursor has the chemical formula B-C(1)-D(1), B-C(1)-C(1)-D(1), B-C(2)-D(1)D(2), BD(3)-C(2)-C(2)-D(1)D(2), B-C(3)-D(1)D(2)D(3), or BD(4)D(5)-C(3)-C(3)-D(1)D(2)D(3), where each of B, D(1), D(2), D(3), D(4), and D(5) are a respective moiety that independently comprises at least one of germanium, tin, or silicon, and where C(1) comprises tellurium, sulfur, or selenium, where C(2) comprises antimony, arsenic, and phosphorous, and where C(3) comprises silicon, germanium, or tin.

In some examples, the reacting component 425 may be configured as or otherwise support a means for reacting a third precursor with the second compound to form a third compound on the second compound, where the third precursor includes at least one of a Group XIII, Group XIV, or Group XV element. In some examples, the reacting component 425 may be configured as or otherwise support a means for reacting a fourth precursor with the third compound to form a fourth compound on the second compound, where the fourth precursor includes one of tellurium, sulfur, antimony, arsenic, phosphorous, selenium, germanium, or tin bonded with a first moiety and a second moiety, the first moiety and the second moiety independently including at least one of germanium, tin, or silicon.

In some examples, the reacting component 425 may be configured as or otherwise support a means for identifying a set of X precursor pairs, where each precursor pair of the set of X precursor pairs includes one of a first set of precursors and one of a second set of precursors, where each precursor pair has an associated quantity of cycles, where X is an integer greater than or equal to 2, where each precursor of the first set of precursors comprises a Group XIII, Group XIV, or Group XV element, and where each precursor of the second set of precursors includes one of tellurium, sulfur, antimony, arsenic, phosphorous, selenium, germanium, or tin bonded with two or moieties, where each of the two or moieties independently includes germanium, tin, or silicon. In some examples, the reacting component 425 may perform, according to the associated quantity of cycles for each precursor pair of the set of X precursor pairs and to form a respective film associated with the precursor pair, a reacting of the one of the first set of precursors to form a respective first compound and a reacting of the one of the second set of precursors with the first compound to form a respective second compound.

In some examples, B includes the chemical formula $R_1R_2R_3A$. In some examples, A includes the at least one of germanium, tin, or silicon for B and. In some examples, each of $R_1$, $R_2$, and $R_3$ are independently selected from hydrogen; deuterium; an alkyl group; an aryl group; an alkoxy; an amide including two substituents, which may be chosen among an alkyl substituent, a silyl substituent (e.g., the silyl group having hydrogen, deuterium, or alkyl substituents), or a germyl substituent (e.g., the germyl group having hydrogen, deuterium, or alkyl substituents); an hydrazide including three substituents, which may be chosen among an alkyl substituent, a silyl substituent (e.g., the silyl group having hydrogen, deuterium, or alkyl substituents), or a germyl substituent (e.g., the germyl group having hydrogen, deuterium, or alkyl substituents); an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; an isofulminate; a —$SiR_aR_bR_c$ moiety; a —$GeR_aR_bR_c$ moiety; a —$SnR_aR_bR_c$ moiety; a —$SiR_aR_bCR_cR_dR_e$ moiety; a —$CR_aR_bSiR_cR_dR_e$ moiety; a —$SiR_aR_bGeR_cR_dR_e$ moiety; or a moiety containing a set of carbon atoms, silicon atoms, germanium atoms, tin atoms, or any combination thereof each fully saturated with respective substituents $R_a$, $R_b$, $R_c$, $R_d$, $R_e$, . . . , $R_x$ and including 1 to 10 carbon atoms, silicon atoms, germanium atoms, tin atoms, or any combination thereof distinct from any carbon, silicon, germanium, or tin within the respective substituents $R_a$, $R_b$, $R_c$, $R_d$, $R_e$, . . . , $R_x$, where x of $R_x$ is an index different than a of $R_a$, where the set of carbon atoms, silicon atoms, germanium atoms, tin atoms, or any combination thereof is linear, branched, or cyclic; and where $R_a$, $R_b$, $R_c$, $R_d$, $R_e$, . . . , $R_x$ is independently selected from hydrogen; deuterium; an alkyl group; an aryl group; an alkoxy; an amide including two substituents, which may be chosen among an alkyl substituent, a silyl substituent (e.g., the silyl group having hydrogen, deuterium, or alkyl substituents), or a germyl substituent (e.g., the germyl group having hydrogen, deuterium, or alkyl substituents); an hydrazide including three substituents, which may be chosen among an alkyl substituent, a silyl substituent (e.g., the silyl group having hydrogen, deuterium, or alkyl substituents), or a germyl substituent (e.g., the germyl group having hydrogen, deuterium, or alkyl substituents); an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate.

In some examples, each of $R_1$, $R_2$, and $R_3$ include the same element or the same compound.

In some examples, D(1) has the chemical formula $X_1R_4R_5R_6$, D(2) has the chemical formula $X_2R_7R_8R_9$, D(3) has the chemical formula $X_3R_{10}R_{11}R_{12}$, D(4) has the chemical formula $X_4R_{13}R_{14}R_{15}$, and D(5) has the chemical formula $X_5R_{16}R_{17}R_{18}$, or any combination thereof, where $X_1$, $X_2$, $X_3$, $X_4$, and $X_5$ each comprise at least one of germanium, tin, or silicon, where each of $R_4$, $R_5$, and $R_6$; each of $R_7$, $R_8$, and $R_9$; each of $R_{10}$, $R_{11}$, and $R_{12}$; each of $R_{13}$, $R_{14}$, and $R_{15}$; each of $R_{16}$, $R_{17}$, and $R_{18}$, or any combination thereof, are independently selected from hydrogen; deuterium; an alkyl group; an aryl group; an alkoxy; an amide including two substituents, which may be chosen among an alkyl substituent, a silyl substituent (e.g., the silyl group having hydrogen, deuterium, or alkyl substituents), or a germyl substituent (e.g., the germyl group having hydrogen, deuterium, or alkyl substituents); an hydrazide including three substituents, which may be chosen among an alkyl substituent, a silyl substituent (e.g., the silyl group having hydrogen, deuterium, or alkyl substituents), or a germyl substituent (e.g., the germyl group having hydrogen, deuterium, or alkyl substituents); an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; an isofulminate; a —$SiR_aR_bR_c$ moiety; a —$GeR_aR_bR_c$ moiety; a —$SnR_aR_bR_c$ moiety; a —$SiR_aR_bCR_cR_dR_e$ moiety; a —$CR_aR_bSiR_cR_dR_e$ moiety; a —$SiR_aR_bGeR_cR_dR_e$ moiety; or a moiety containing a set of carbon atoms, silicon atoms, germanium atoms, tin atoms, or any combination thereof each fully saturated with respective substituents $R_a$, $R_b$, $R_c$, $R_d$, $R_e$, . . . , $R_x$ and including 1 to 10 carbon atoms, silicon atoms, germanium atoms, tin atoms, or any combination thereof distinct from any carbon, silicon, germanium, or tin within the respective substituents $R_a$, $R_b$, $R_c$, $R_d$, $R_e$, . . . , $R_x$, where x of $R_x$ is an index different than a of $R_a$, where the set of carbon atoms, silicon atoms, germanium atoms, tin atoms, or any combination thereof is linear, branched, or cyclic; and where $R_a$, $R_b$, $R_c$, $R_d$, $R_e$, . . . , $R_x$ is independently selected from hydrogen; deuterium; an alkyl group; an aryl group; an alkoxy; an amide including two substituents, which may be chosen among an alkyl substituent, a silyl substituent (e.g., the silyl group having hydrogen, deuterium, or alkyl substituents), or a germyl substituent (e.g., the germyl group having hydrogen, deuterium, or alkyl substituents); an hydrazide including three substituents, which may be chosen among an alkyl substituent, a silyl substituent (e.g., the silyl group having hydrogen, deuterium, or alkyl substituents), or a germyl substituent (e.g., the germyl group having hydrogen, deuterium, or alkyl substituents); an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate.

In some examples, each of $R_4$, $R_5$, and $R_6$; each of $R_7$, $R_8$, and $R_9$; each of $R_{10}$, $R_{11}$, and $R_{12}$; each of $R_{13}$, $R_{14}$, and $R_{15}$; each of $R_{16}$, $R_{17}$, and $R_{18}$, or any combination thereof include the same element or compound.

The forming component 430 may be configured as or otherwise support a means for forming a plurality of stacks of materials on a substrate. The exposing component 435 may be configured as or otherwise support a means for exposing the plurality of stacks of materials to a first precursor to form a first compound including a first element on the plurality of stacks of materials, where the first compound includes at least one of a Group XIII, Group XIV, or Group XV element. In some examples, the exposing component 435 may be configured as or otherwise support a means for exposing the plurality of stacks of materials to a second precursor to form a second compound on the plurality of stacks of materials, where the second precursor has the chemical formula B-C(1)-D(1), B-C(1)-C(1)-D(1), B-C(2)-D(1)D(2), BD(3)-C(2)-C(2)-D(1)D(2), B-C(3)-D(1)D(2)D(3), or BD(4)D(5)-C(3)-C(3)-D(1)D(2)D(3), where each of B, D(1), D(2), D(3), D(4), and D(5) are a respective moiety that independently comprises at least one of germanium, tin, or silicon, and where C(1) comprises tellurium, sulfur, or selenium, where C(2) comprises antimony, arsenic, and phosphorous, and where C(3) comprises silicon, germanium, or tin.

In some examples, the exposing component 435 may be configured as or otherwise support a means for exposing the second compound to a third precursor to form a third compound on the plurality of stacks of materials, where the third precursor includes at least one of a Group XIII, Group XIV, or Group XV element. In some examples, the exposing component 435 may be configured as or otherwise support a means for exposing the third compound to a fourth precursor to form a fourth compound on the second compound, where the fourth precursor comprises one of tellurium, sulfur, antimony, arsenic, phosphorous, selenium, germanium, or tin bonded with a first moiety and a second moiety, the first moiety and the second moiety independently including at least one of germanium, tin, or silicon.

In some examples, the exposing component 435 may be configured as or otherwise support a means for identifying a set of X precursors, where each precursor pair of the set of X precursor pairs includes one of a first set of precursors and one of a second set of precursors, where each precursor pair has an associated quantity of cycles, where X is an integer greater than 2, where each precursor of the first set of precursors includes at least one of a Group XIII, Group XIV, or Group XV element, and where each precursor of the second set of precursors includes one of tellurium, sulfur, antimony, arsenic, phosphorous, selenium, germanium, or tin bonded with two or moieties, where each of the two or moieties independently comprises germanium, tin, or silicon. In some examples, the exposing component may be configured as or otherwise support a means for performing, according to the associated quantity of cycles for each precursor pair of the set of X precursor pairs and to form a respective film associated with the precursor pair, an exposing with the one of the first set of precursors to form a respective first compound and an exposing of the respective first compound with the one of the second set of precursors to form a respective second compound.

In some examples, B includes the chemical formula $R_1R_2R_3A$. In some examples, A includes the at least one of germanium, tin, or silicon. In some examples, each of $R_1$, $R_2$, and $R_3$ are independently selected from hydrogen; deuterium; an alkyl group; an aryl group; an alkoxy; an amide including two substituents, which may be chosen among an alkyl substituent, a silyl substituent (e.g., the silyl group having hydrogen, deuterium, or alkyl substituents), or a germyl substituent (e.g., the germyl group having hydrogen, deuterium, or alkyl substituents); an hydrazide including three substituents, which may be chosen among an alkyl substituent, a silyl substituent (e.g., the silyl group having hydrogen, deuterium, or alkyl substituents), or a germyl substituent (e.g., the germyl group having hydrogen, deuterium, or alkyl substituents); an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; an isofulminate; a $—SiR_aR_bR_c$ moiety; a $—GeR_aR_bR_c$ moiety; a $—SnR_aR_bR_c$ moiety; a $—SiR_aR_bCR_cR_dR_e$ moiety; a $—CR_aR_bSiR_cR_dR_e$ moiety; a $—SiR_aR_bGeR_cR_dR_e$ moiety; or a moiety containing a set of carbon atoms, silicon atoms, germanium atoms, tin atoms, or any combination thereof each fully saturated with respective substituents $R_a$, $R_b$, $R_c$, $R_d$, $R_e$, . . . , $R_x$ and including 1 to 10 carbon atoms, silicon atoms, germanium atoms, tin atoms, or any combination thereof distinct from any carbon, silicon, germanium, or tin within the respective substituents $R_a$, $R_b$, $R_c$, $R_d$, $R_e$, . . . , $R_x$, where x of $R_x$ is an index different than a of $R_a$, where the set of carbon atoms, silicon atoms, germanium atoms, tin atoms, or any combination thereof is linear, branched, or cyclic; and where $R_a$, $R_b$, $R_c$, $R_d$, $R_e$, . . . , $R_x$ is independently selected from hydrogen; deuterium; an alkyl group; an aryl group; an alkoxy; an amide including two substituents, which may be chosen among an alkyl substituent, a silyl substituent (e.g., the silyl group having hydrogen, deuterium, or alkyl substituents), or a germyl substituent (e.g., the germyl group having hydrogen, deuterium, or alkyl substituents); an hydrazide including three substituents, which may be chosen among an alkyl substituent, a silyl substituent (e.g., the silyl group having hydrogen, deuterium, or alkyl substituents), or a germyl substituent (e.g., the germyl group having hydrogen, deuterium, or alkyl substituents); an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate.

In some examples, each of $R_1$, $R_2$, and $R_3$ include the same element or the same compound.

In some examples, D(1) has the chemical formula $X_1R_4R_5R_6$, D(2) has the chemical formula $X_2R_7R_8R_9$, D(3) has the chemical formula $X_3R_{10}R_{11}R_{12}$, D(4) has the chemical formula $X_4R_{13}R_{14}R_{15}$, and D(5) has the chemical formula $X_5R_{16}R_{17}R_{18}$, or any combination thereof, where $X_1$, $X_2$, $X_3$, $X_4$, and $X_5$ each comprise at least one of germanium, tin, or silicon, where each of $R_4$, $R_5$, and $R_6$; each of $R_7$, $R_8$, and $R_9$; each of $R_{10}$, $R_{11}$, and $R_{12}$; each of $R_{13}$, $R_{14}$, and $R_{15}$; each of $R_{16}$, $R_{17}$, and $R_{18}$, or any combination thereof, are independently selected from hydrogen; deuterium; an alkyl group; an aryl group; an alkoxy; an amide including two substituents, which may be chosen among an alkyl substituent, a silyl substituent (e.g., the silyl group having hydrogen, deuterium, or alkyl substituents), or a germyl substituent (e.g., the germyl group having hydrogen, deuterium, or alkyl substituents); an hydrazide including three substituents, which may be chosen among an alkyl substituent, a silyl substituent (e.g., the silyl group having hydrogen, deuterium, or alkyl substituents), or a germyl substituent (e.g., the germyl group having hydrogen, deuterium, or alkyl substituents); an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; an isofulminate; a $—SiR_aR_bR_c$ moiety; a $—GeR_aR_bR_c$ moiety; a $—SnR_aR_bR_c$ moiety; a $—SiR_aR_bCR_cR_dR_e$ moiety; a $—CR_aR_bSiR_cR_dR_e$ moiety; a $—SiR_aR_bGeR_cR_dR_e$ moiety; or a moiety containing a set of carbon atoms, silicon atoms, germanium atoms, tin atoms, or any combination thereof each fully saturated with respective substituents $R_a$, $R_b$, $R_c$, $R_d$, $R_e$, . . . , $R_x$ and including 1 to 10 carbon atoms, silicon atoms, germanium atoms, tin atoms, or any combination thereof distinct from any carbon, silicon, germanium, or tin within the respective substituents $R_a$, $R_b$, $R_c$, $R_d$, $R_e$, . . . , $R_x$, where x of $R_x$ is an index different than a of $R_a$, where the set of carbon atoms, silicon atoms, germanium atoms, tin atoms, or any combination thereof is linear, branched, or cyclic; and where $R_a$, $R_b$, $R_c$, $R_d$, $R_e$, . . . , $R_x$ is independently selected from hydrogen; deuterium; an alkyl group; an aryl group; an alkoxy; an amide including two substituents, which may be chosen among an alkyl substituent, a silyl substituent (e.g., the silyl group having hydrogen, deuterium, or alkyl substituents), or a germyl substituent (e.g., the germyl group having hydrogen, deuterium, or alkyl substituents); an hydrazide including three substituents, which may be chosen among an alkyl substituent, a silyl substituent (e.g., the silyl group having hydrogen, deuterium, or alkyl substituents), or a germyl substituent (e.g., the germyl group having hydrogen, deuterium, or alkyl substituents); an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate.

In some examples, each of $R_4$, $R_5$, and $R_6$; each of $R_7$, $R_8$, and $R_9$; each of $R_{10}$, $R_{11}$, and $R_{12}$; each of $R_{13}$, $R_{14}$, and $R_{15}$; each of $R_{16}$, $R_{17}$, and $R_{18}$, or any combination thereof include the same element or compound.

Figure 5:
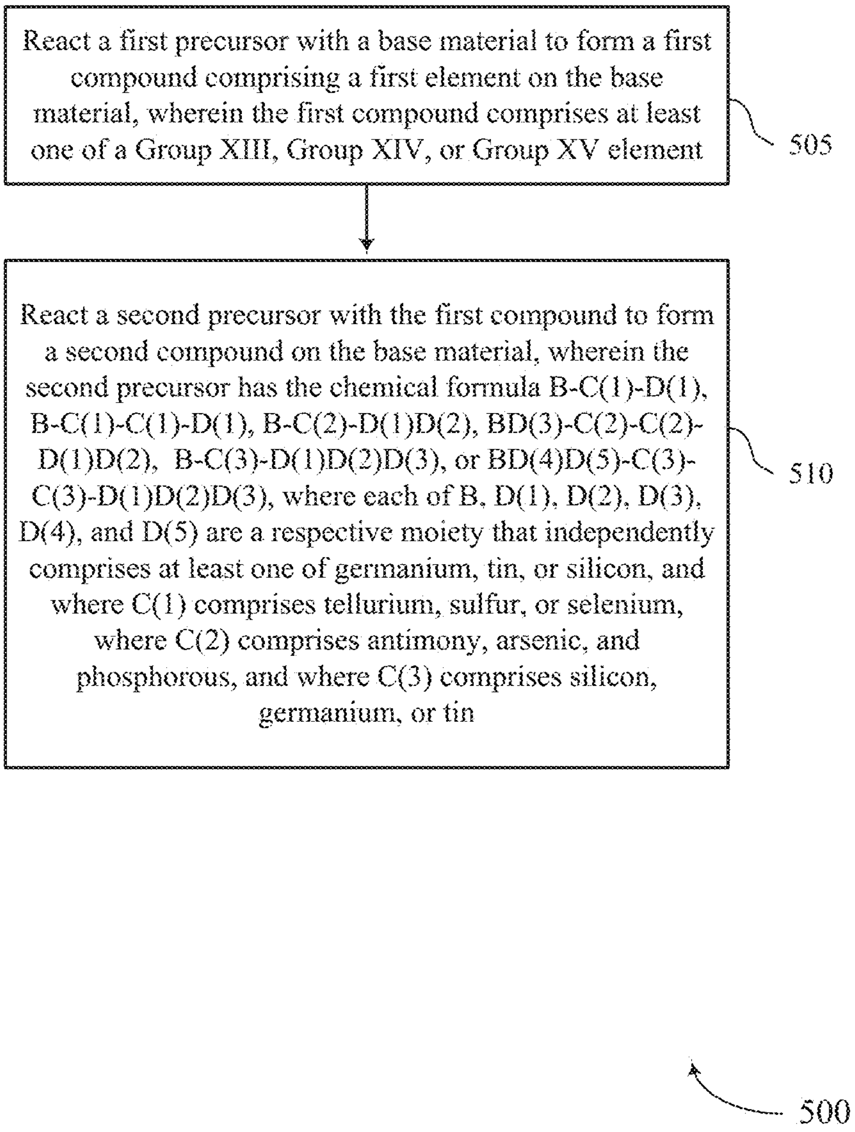
FIGS. 5 and 6 show flowcharts illustrating a method or methods that support atomic layer deposition using tin-based or germanium-based precursors in accordance with examples as disclosed herein.

FIG. 5 shows a flowchart illustrating a method 500 that supports atomic layer deposition using tin-based or germanium-based precursors in accordance with examples as disclosed herein. The operations of method 500 may be implemented by a controller or its components as described herein. For example, the operations of method 500 may be performed by a controller as described with reference to FIGS. 1 through 4. In some examples, a controller may execute a set of instructions to control the functional elements of the device to perform the described functions. Additionally, or alternatively, the controller may perform aspects of the described functions using special-purpose hardware.

At 505, the method may include reacting a first precursor with a base material to form a first compound including a first element on the base material, where the first compound includes at least one of a Group XIII, Group XIV, or Group XV element. The operations of 505 may be performed in accordance with examples as disclosed herein. In some examples, aspects of the operations of 505 may be performed by a reacting component 425 as described with reference to FIG. 4.

At 510, the method may include reacting a second precursor with the first compound to form a second compound on the base material, where the second precursor has a the chemical formula B-C(1)-D(1), B-C(1)-C(1)-D(1), B-C(2)-D(1)D(2), BD(3)-C(2)-C(2)-D(1)D(2), B-C(3)-D(1)D(2)D(3), or BD(4)D(5)-C(3)-C(3)-D(1)D(2)D(3), where each of B, D(1), D(2), D(3), D(4), and D(5) are a respective moiety that independently comprises at least one of germanium, tin, or silicon, and where C(1) comprises tellurium, sulfur, or selenium, where C(2) comprises antimony, arsenic, and phosphorous, and where C(3) comprises silicon, germanium, or tin. The operations of 510 may be performed in accordance with examples as disclosed herein. In some examples, aspects of the operations of 510 may be performed by a reacting component 425 as described with reference to FIG. 4.

In some examples, an apparatus as described herein may perform a method or methods, such as the method 500. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for reacting a first precursor with a base material to form a first compound including a first element on the base material, where the first compound includes at least one of a Group XIII, Group XIV, or Group XV element and reacting a second precursor with the first compound to form a second compound on the base material, wherein the second precursor comprises the chemical formula B-C(1)-D(1), B-C(1)-C(1)-D(1), B-C(2)-D(1)D(2), BD(3)-C(2)-C(2)-D(1)D(2), B-C(3)-D(1)D(2)D(3), or BD(4)D(5)-C(3)-C(3)-D(1)D(2)D(3), wherein each of B, D(1), D(2), D(3), D(4), and D(5) are a respective moiety that independently comprises at least one of germanium, tin, or silicon, and wherein C(1) comprises tellurium, sulfur, or selenium, wherein C(2) comprises antimony, arsenic, and phosphorous, and wherein C(3) comprises silicon, germanium, or tin.

Aspect 2: The method, apparatus, or non-transitory computer-readable medium of aspect 1, further including operations, features, circuitry, logic, means, or instructions, or any combination thereof for reacting a third precursor with the second compound to form a third compound on the second compound, wherein the third precursor comprises at least one of a Group XIII, Group XIV, or Group XV element; and reacting a fourth precursor with the third compound to form a fourth compound on the second compound, wherein the fourth precursor comprises one of tellurium, sulfur, antimony, arsenic, phosphorous, selenium, germanium, or tin bonded with a first moiety and a second moiety, the first moiety and the second moiety independently comprising at least one of germanium, tin, or silicon.

Aspect 3: The method, apparatus, or non-transitory computer-readable medium of aspect 2, further including operations, features, circuitry, logic, means, or instructions, or any combination thereof for identifying a set of X precursor pairs, wherein each precursor pair of the set of X precursor pairs comprises one of a first set of precursors and one of a second set of precursors, wherein each precursor pair has an associated quantity of cycles, wherein X is an integer greater than or equal to 2, wherein each precursor of the first set of precursors comprises a Group XIII, Group XIV, or Group XV element, and wherein each precursor of the second set of precursors comprises one of tellurium, sulfur, antimony, arsenic, phosphorous, selenium, germanium, or tin bonded with two or moieties, wherein each of the two or moieties independently comprises germanium, tin, or silicon; and performing, according to the associated quantity of cycles for each precursor pair of the set of X precursor pairs and to form a respective film associated with the precursor pair, a reacting of the one of the first set of precursors to form a respective first compound and a reacting of the one of the second set of precursors with the first compound to form a respective second compound.

Aspect 4: The method, apparatus, or non-transitory computer-readable medium of aspects 1 through 3, where B includes the chemical formula $R_1R_2R_3A$; A includes the at least one of germanium, tin, or silicon for B and; and each of $R_1$, $R_2$, and $R_3$ are independently selected from hydrogen; deuterium; an alkyl group; an aryl group; an alkoxy; an amide comprising two substituents selected from an alkyl substituent, a silyl substituent, and a germyl substituent, wherein one or more of the silyl substituent and the germyl substituent comprises one or more of hydrogen substituents, deuterium substituents, or alkyl substituents; a hydrazide comprising three substituents selected from an alkyl substituent, a silyl substituent, and a germyl substituent, wherein one or more of the silyl substituent and the germyl substituent comprises one or more of hydrogen substituents, deuterium substituents, or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; an isofulminate; a $—SiR_aR_bR_c$ moiety; a $—GeR_aR_bR_c$ moiety; a $—SnR_aR_bR_c$ moiety; a $—SR_aR_bCR_cR_dR_e$ moiety; a $—CR_aR_bSiR_cR_dR_e$ moiety; a $—SiR_aR_bGeR_eR_dR_e$ moiety; or a moiety containing a set of carbon atoms, silicon atoms, germanium atoms, tin atoms, or any combination thereof each fully saturated with respective substituents $R_a$, $R_b$, $R_c$, $R_d$, $R_e$, . . . , $R_x$ and comprising 1 to 10 carbon atoms, silicon atoms, germanium atoms, tin atoms, or any combination thereof distinct from any carbon, silicon, germanium, or tin within the respective substituents $R_a$, $R_b$, $R_c$, $R_d$, $R_e$, . . . , $R_x$, wherein x of $R_x$ is an index different than a of $R_a$, wherein the set of carbon atoms, silicon atoms, germanium atoms, tin atoms, or any combination thereof is linear, branched, or cyclic; and wherein $R_a$, $R_b$, $R_c$, $R_d$, $R_e$, . . . , $R_x$ is independently selected from hydrogen; deuterium; an alkyl group; an aryl group; an alkoxy; an amide comprising two substituents selected from an alkyl substituent, a silyl substituent, and a germyl substituent, wherein one or more of the silyl substituent and the germyl substituent comprises one or more of hydrogen substituents, deuterium substituents, or alkyl substituents; a hydrazide comprising three substituents selected from an alkyl substituent, a silyl substituent, and a germyl substituent, wherein one or more of the silyl substituent and the germyl substituent comprises one or more of hydrogen substituents, deuterium substituents, or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate.

Aspect 5: The method, apparatus, or non-transitory computer-readable medium of aspect 4, where each of $R_1$, $R_2$, and $R_3$ include the same element or the same compound.

Aspect 6: The method, apparatus, or non-transitory computer-readable medium of any of aspects 1 through 5, (1) comprises the chemical formula $X_1R_4R_5R_6$, D(2) comprises the chemical formula $X_2R_7R_8R_9$, D(3) comprises the chemical formula $X_3R_{10}R_{11}R_{12}$, D(4) comprises the chemical formula $X_4R_{13}R_{14}R_{15}$, D(5) comprises the chemical formula $X_5R_{16}R_{17}R_{18}$, or any combination thereof, wherein $X_1$, $X_2$, $X_3$, $X_4$, and $X_5$ each comprise at least one of germanium, tin, or silicon, wherein each of $R_4$, $R_5$, and $R_6$; each of $R_7$, $R_8$, and $R_9$; each of $R_{10}$, $R_{11}$, and $R_{12}$; each of $R_{13}$, $R_{14}$, and $R_{15}$; each of $R_{16}$, $R_{17}$, and $R_{18}$, or any combination thereof, are independently selected from hydrogen; deuterium; an alkyl group; an aryl group; an alkoxy; an amide comprising two substituents selected from an alkyl substituent, a silyl substituent, and a germyl substituent, wherein one or more of the silyl substituent and the germyl substituent comprises one or more of hydrogen substituents, deuterium substituents, or alkyl substituents; a hydrazide comprising three substituents selected from an alkyl substituent, a silyl substituent, and a germyl substituent, wherein one or more of the silyl substituent and the germyl substituent comprises one or more of hydrogen substituents, deuterium substituents, or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; an isofulminate; a $—SiR_aR_bR_c$ moiety; a $—GeR_aR_bR_c$ moiety; a $—SnR_aR_bR_c$ moiety; a $—SiR_aR_bCR_cR_dR_e$ moiety; a $—CR_aR_bSiR_cR_dR_e$ moiety; a $—SiR_aR_bGeR_cR_dR_e$ moiety; or a moiety containing a set of carbon atoms, silicon atoms, germanium atoms, tin atoms, or any combination thereof each fully saturated with respective substituents $R_a$, $R_b$, $R_c$, $R_d$, $R_e$, . . . , $R_x$ and comprising 1 to 10 carbon atoms, silicon atoms, germanium atoms, tin atoms, or any combination thereof distinct from any carbon, silicon, germanium, or tin within the respective substituents $R_a$, $R_b$, $R_c$, $R_d$, $R_e$, . . . , $R_x$, wherein x of $R_x$ is an index different than a of $R_a$, wherein the set of carbon atoms, silicon atoms, germanium atoms, tin atoms, or any combination thereof is linear, branched, or cyclic; and wherein $R_a$, $R_b$, $R_c$, $R_d$, $R_e$, . . . , $R_x$ is independently selected from hydrogen; deuterium; an alkyl group; an aryl group; an alkoxy; an amide comprising two substituents selected from an alkyl substituent, a silyl substituent, and a germyl substituent, wherein one or more of the silyl substituent and the germyl substituent comprises one or more of hydrogen substituents, deuterium substituents, or alkyl substituents; a hydrazide comprising three substituents selected from an alkyl substituent, a silyl substituent, and a germyl substituent, wherein one or more of the silyl substituent and the germyl substituent comprises one or more of hydrogen substituents, deuterium substituents, or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate.

Aspect 7: The method, apparatus, or non-transitory computer-readable medium of aspect 6, wherein each of $R_4$, $R_5$, and $R_6$; each of $R_7$, $R_8$, and $R_9$; each of $R_{10}$, $R_{11}$, and $R_{12}$; each of $R_{13}$, $R_{14}$, and $R_{15}$; each of $R_{16}$, $R_{17}$, and $R_{18}$, or any combination thereof comprise the same element or compound.

Figure 6:
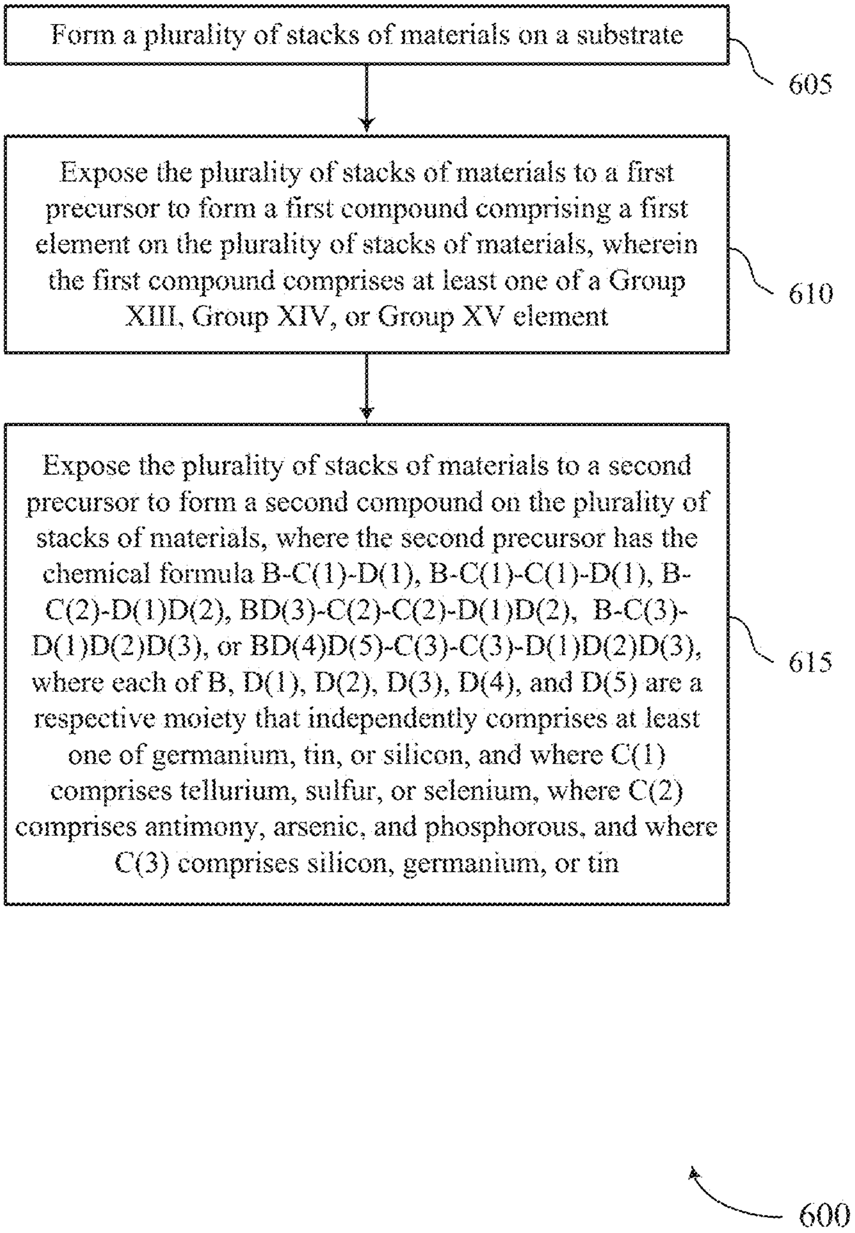

FIG. 6 shows a flowchart illustrating a method 600 that supports atomic layer deposition using tin-based or germanium-based precursors in accordance with examples as disclosed herein. The operations of method 600 may be implemented by a controller or its components as described herein. For example, the operations of method 600 may be performed by a controller as described with reference to FIGS. 1 through 4. In some examples, a controller may execute a set of instructions to control the functional elements of the device to perform the described functions. Additionally, or alternatively, the controller may perform aspects of the described functions using special-purpose hardware.

At 605, the method may include forming a plurality of stacks of materials on a substrate. The operations of 605 may be performed in accordance with examples as disclosed herein. In some examples, aspects of the operations of 605 may be performed by a forming component 430 as described with reference to FIG. 4.

At 610, the method may include exposing the plurality of stacks of materials to a first precursor to form a first compound including a first element on the plurality of stacks of materials, where the first compound includes at least one of a Group XIII, Group XIV, or Group XV element. The operations of 610 may be performed in accordance with examples as disclosed herein. In some examples, aspects of the operations of 610 may be performed by an exposing component 435 as described with reference to FIG. 4.

At 615, the method may include exposing the plurality of stacks of materials to a second precursor to form a second compound on the plurality of stacks of materials, where the second precursor has the chemical formula B-C(1)-D(1), B-C(1)-C(1)-D(1), B-C(2)-D(1)D(2), BD(3)-C(2)-C(2)-D(1)D(2), B-C(3)-D(1)D(2)D(3), or BD(4)D(5)-C(3)-C(3)-D(1)D(2)D(3), where each of B, D(1), D(2), D(3), D(4), and D(5) are a respective moiety that independently comprises at least one of germanium, tin, or silicon, and where C(1) comprises tellurium, sulfur, or selenium, where C(2) comprises antimony, arsenic, and phosphorous, and where C(3) comprises silicon, germanium, or tin. The operations of 615 may be performed in accordance with examples as disclosed herein. In some examples, aspects of the operations of 615 may be performed by an exposing component 435 as described with reference to FIG. 4.

In some examples, an apparatus as described herein may perform a method or methods, such as the method 600. The apparatus may include features, circuitry, logic, means, or instructions (e.g., a non-transitory computer-readable medium storing instructions executable by a processor), or any combination thereof for performing the following aspects of the present disclosure:

Aspect 8: A method, apparatus, or non-transitory computer-readable medium including operations, features, circuitry, logic, means, or instructions, or any combination thereof for forming a plurality of stacks of materials on a substrate; exposing the plurality of stacks of materials to a first precursor to form a first compound including a first element on the plurality of stacks of materials, where the first compound includes at least one of a Group XIII, Group XIV, or Group XV element; and exposing the plurality of stacks of materials to a second precursor to form a second compound on the plurality of stacks of materials, wherein the second precursor comprises the chemical formula B-C(1)-D(1), B-C(1)-C(1)-D(1), B-C(2)-D(1)D(2), BD(3)-C(2)-C(2)-D(1)D(2), B-C(3)-D(1)D(2)D(3), or BD(4)D(5)-C(3)-C(3)-D(1)D(2)D(3), and wherein each of B, D(1), D(2), D(3), D(4), and D(5) are a respective moiety that independently comprises at least one of germanium, tin, or silicon, and wherein C(1) comprises tellurium, sulfur, or selenium, wherein C(2) comprises antimony, arsenic, and phosphorous, and wherein C(3) comprises silicon, germanium, or tin.

Aspect 9: The method, apparatus, or non-transitory computer-readable medium of aspect 8, further including operations, features, circuitry, logic, means, or instructions, or any combination thereof for exposing the second compound to a third precursor to form a third compound on the plurality of stacks of materials, wherein the third precursor comprises at least one of a Group XIII, Group XIV, or Group XV element; and exposing the third compound to a fourth precursor to form a fourth compound on the second compound, wherein the fourth precursor comprises one of tellurium, sulfur, antimony, arsenic, phosphorous, selenium, germanium, or tin bonded with a first moiety and a second moiety, the first moiety and the second moiety independently comprising at least one of germanium, tin, or silicon.

Aspect 10: The method, apparatus, or non-transitory computer-readable medium of aspect 9, further including operations, features, circuitry, logic, means, or instructions, or any combination thereof for identifying a set of X precursors, wherein each precursor pair of the set of X precursor pairs comprises one of a first set of precursors and one of a second set of precursors, wherein each precursor pair has an associated quantity of cycles, wherein X is an integer greater than 2, wherein each precursor of the first set of precursors comprises at least one of a Group XIII, Group XIV, or Group XV element, and wherein each precursor of the second set of precursors comprises one of tellurium, sulfur, antimony, arsenic, phosphorous, selenium, germanium, or tin bonded with two or moieties, wherein each of the two or moieties independently comprises germanium, tin, or silicon; and performing, according to the associated quantity of cycles for each precursor pair of the set of X precursor pairs and to form a respective film associated with the precursor pair, an exposing with the one of the first set of precursors to form a respective first compound and an exposing of the respective first compound with the one of the second set of precursors to form a respective second compound.

Aspect 11: The method, apparatus, or non-transitory computer-readable medium of aspects 8 through 10, where B includes the chemical formula $R_1R_2R_3A$; A includes the at least one of germanium, tin, or silicon for B and; and each of $R_1$, $R_2$, and $R_3$ are independently selected from hydrogen; deuterium; an alkyl group; an aryl group; an alkoxy; an amide comprising two substituents selected from an alkyl substituent, a silyl substituent, and a germyl substituent, wherein one or more of the silyl substituent and the germyl substituent comprises one or more of hydrogen substituents, deuterium substituents, or alkyl substituents; a hydrazide comprising three substituents selected from an alkyl substituent, a silyl substituent, and a germyl substituent, wherein one or more of the silyl substituent and the germyl substituent comprises one or more of hydrogen substituents, deuterium substituents, or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; an isofulminate; a —$SiR_aR_bR_c$ moiety; a —$GeR_aR_bR_c$ moiety; a —$SnR_aR_bR_c$ moiety; a —$SiR_aR_bCR_cR_dR_e$ moiety; a —$CR_aR_bSiR_cR_dR_e$ moiety; a —$SiR_aR_bGeR_cR_dR_e$ moiety; or a moiety containing a set of carbon atoms, silicon atoms, germanium atoms, tin atoms, or any combination thereof each fully saturated with respective substituents $R_a$, $R_b$, $R_c$, $R_d$, $R_e$, . . . , $R_x$ and comprising 1 to 10 carbon atoms, silicon atoms, germanium atoms, tin atoms, or any combination thereof distinct from any carbon, silicon, germanium, or tin within the respective substituents $R_a$, $R_b$, $R_c$, $R_d$, $R_e$, . . . , $R_x$, wherein x of $R_x$ is an index different than a of $R_a$, wherein the set of carbon atoms, silicon atoms, germanium atoms, tin atoms, or any combination thereof is linear, branched, or cyclic; and wherein $R_a$, $R_b$, $R_c$, $R_d$, $R_e$, . . . , $R_x$ is independently selected from hydrogen; deuterium; an alkyl group; an aryl group; an alkoxy; an amide comprising two substituents selected from an alkyl substituent, a silyl substituent, and a germyl substituent, wherein one or more of the silyl substituent and the germyl substituent comprises one or more of hydrogen substituents, deuterium substituents, or alkyl substituents; a hydrazide comprising three substituents selected from an alkyl substituent, a silyl substituent, and a germyl substituent, wherein one or more of the silyl substituent and the germyl substituent comprises one or more of hydrogen substituents, deuterium substituents, or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate.

Aspect 12: The method, apparatus, or non-transitory computer-readable medium of aspect 11, where each of $R_1$, $R_2$, and $R_3$ include the same element or the same compound.

Aspect 13: The method, apparatus, or non-transitory computer-readable medium of any of aspects 8 through 12, D(1) comprises the chemical formula $X_1R_4R_5R_6$, D(2) comprises the chemical formula $X_2R_7R_8R_9$, D(3) comprises the chemical formula $X_3R_{10}R_{11}R_{12}$, D(4) comprises the chemical formula $X_4R_{13}R_{14}R_{15}$, D(5) comprises the chemical formula $X_5R_{16}R_{17}R_{18}$, or any combination thereof, wherein $X_1$, $X_2$, $X_3$, $X_4$, and $X_5$ each comprise at least one of germanium, tin, or silicon, wherein each of $R_4$, $R_5$, and $R_6$; each of $R_7$, $R_8$, and $R_9$; each of $R_{10}$, $R_{11}$, and $R_{12}$; each of $R_{13}$, $R_{14}$, and $R_{15}$; each of $R_{16}$, $R_{17}$, and $R_{18}$, or any combination thereof, are independently selected from hydrogen; deuterium; an alkyl group; an aryl group; an alkoxy; an amide comprising two substituents selected from an alkyl substituent, a silyl substituent, and a germyl substituent, wherein one or more of the silyl substituent and the germyl substituent comprises one or more of hydrogen substituents, deuterium substituents, or alkyl substituents; a hydrazide comprising three substituents selected from an alkyl substituent, a silyl substituent, and a germyl substituent, wherein one or more of the silyl substituent and the germyl substituent comprises one or more of hydrogen substituents, deuterium substituents, or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; an isofulminate; a —$SiR_aR_bR_c$ moiety; a —$GeR_aR_bR_c$ moiety; a —$SnR_aR_bR_c$ moiety; a —$SiR_aR_bCR_cR_dR_e$ moiety; a —$CR_aR_bSiR_cR_dR_e$ moiety; a —$SiR_aR_bGeR_cR_dR_e$ moiety;

or a moiety containing a set of carbon atoms, silicon atoms, germanium atoms, tin atoms, or any combination thereof each fully saturated with respective substituents $R_a$, $R_b$, $R_c$, $R_d$, $R_e$, . . . , $R_x$ and comprising 1 to 10 carbon atoms, silicon atoms, germanium atoms, tin atoms, or any combination thereof distinct from any carbon, silicon, germanium, or tin within the respective substituents $R_a$, $R_b$, $R_c$, $R_d$, $R_e$, . . . , $R_x$, wherein x of $R_x$ is an index different than a of $R_a$, wherein the set of carbon atoms, silicon atoms, germanium atoms, tin atoms, or any combination thereof is linear, branched, or cyclic; and wherein $R_a$, $R_b$, $R_c$, $R_d$, $R_e$, . . . , $R_x$ is independently selected from hydrogen; deuterium; an alkyl group; an aryl group; an alkoxy; an amide comprising two substituents selected from an alkyl substituent, a silyl substituent, and a germyl substituent, wherein one or more of the silyl substituent and the germyl substituent comprises one or more of hydrogen substituents, deuterium substituents, or alkyl substituents; a hydrazide comprising three substituents selected from an alkyl substituent, a silyl substituent, and a germyl substituent, wherein one or more of the silyl substituent and the germyl substituent comprises one or more of hydrogen substituents, deuterium substituents, or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate.

Aspect 14: The method, apparatus, or non-transitory computer-readable medium of aspect 13, wherein each of $R_4$, $R_5$, and $R_6$; each of $R_7$, $R_8$, and $R_9$; each of $R_{10}$, $R_{11}$, and $R_{12}$; each of $R_{13}$, $R_{14}$, and $R_{15}$; each of $R_{16}$, $R_{17}$, and $R_{18}$, or any combination thereof comprise the same element or compound.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 15: An apparatus, including: a plurality of stacks of materials on a substrate, at least one material of the plurality of stacks of materials including a memory material; and a film on the plurality of stacks of materials formed by exposing the plurality of stacks of materials to a first precursor to form a first compound comprising a first element on the plurality of stacks of materials and by exposing the plurality of stacks of materials to a second precursor to form a second compound on the plurality of stacks of materials, wherein the first compound comprises at least one of a Group XIII, Group XIV, or Group XV element and the second precursor comprises the chemical formula B-C(1)-D(1), B-C(1)-C(1)-D(1), B-C(2)-D(1)D(2), BD(3)-C(2)-C(2)-D(1)D(2), B-C(3)-D(1)D(2)D(3), or BD(4)D(5)-C(3)-C(3)-D(1)D(2)D(3), wherein each of B, D(1), D(2), D(3), D(4), and D(5) are a respective moiety that independently comprises at least one of germanium, tin, or silicon, and wherein C(1) comprises tellurium, sulfur, or selenium, wherein C(2) comprises antimony, arsenic, and phosphorous, and wherein C(3) comprises silicon, germanium, or tin.

Aspect 16: The apparatus of aspect 15, further including a second film on the film formed by exposing the film to a third precursor to form a third compound on the plurality of stacks of materials and exposing the fourth compound to a fourth precursor to form a fourth compound on the film, wherein the third precursor comprises at least one of a Group XIII, Group XIV, or Group XV element and the fourth precursor comprises one of tellurium, sulfur, antimony, arsenic, phosphorous, selenium, germanium, or tin bonded with a first moiety and a second moiety, the first moiety and the second moiety independently comprising at least one of germanium, tin, or silicon.

Aspect 17: The apparatus of aspect 16, further including a set of films, wherein each of the set of films is associated with a precursor pair of a set of X precursor pairs, wherein each precursor pair of the set of X precursor pairs comprises one of a first set of precursors and one of a second set of precursors, wherein each precursor pair has an associated quantity of cycles, wherein each precursor of the first set of precursors comprises a Group XIII, Group XIV, or Group XV element, wherein each precursor of the second set of precursors comprises one of tellurium, sulfur, antimony, arsenic, phosphorous, selenium, germanium, or tin bonded with two or moieties, wherein each of the two or moieties independently comprises germanium, tin, or silicon, and wherein each of the set of films is formed by performing, according to the associated quantity of cycles for the associated precursor pair of the set of precursor pairs, an exposing of the each film with the one of the first set of precursors to form a respective first compound and exposing of the respective first compound with the one of the second set of precursors to form a respective second compound.

Aspect 18: The apparatus of aspects 15 through 17, where B includes the chemical formula $R_1R_2R_3A$, A includes the at least one of germanium, tin, or silicon for B and each of $R_1$, $R_2$, and $R_3$ are independently selected from hydrogen; deuterium; an alkyl group; an aryl group; an alkoxy; an amide comprising two substituents selected from an alkyl substituent, a silyl substituent, and a germyl substituent, wherein one or more of the silyl substituent and the germyl substituent comprises one or more of hydrogen substituents, deuterium substituents, or alkyl substituents; a hydrazide comprising three substituents selected from an alkyl substituent, a silyl substituent, and a germyl substituent, wherein one or more of the silyl substituent and the germyl substituent comprises one or more of hydrogen substituents, deuterium substituents, or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; an isofulminate; a $—SiR_aR_bR_c$ moiety; a $—GeR_aR_bR_c$ moiety; a $—SnR_aR_bR_c$ moiety; a $—SiR_aR_bCR_cR_dR_e$ moiety; a $—CR_aR_bSiR_cR_dR_e$ moiety; a $—SiR_aR_bGeR_cR_dR_e$ moiety; or a moiety containing a set of carbon atoms, silicon atoms, germanium atoms, tin atoms, or any combination thereof each fully saturated with respective substituents $R_a$, $R_b$, $R_c$, $R_d$, $R_e$, . . . , $R_x$ and comprising 1 to 10 carbon atoms, silicon atoms, germanium atoms, tin atoms, or any combination thereof distinct from any carbon, silicon, germanium, or tin within the respective substituents $R_a$, $R_b$, $R_c$, $R_d$, $R_e$, . . . , $R_x$, wherein x of $R_x$ is an index different than a of $R_a$, wherein the set of carbon atoms, silicon atoms, germanium atoms, tin atoms, or any combination thereof is linear, branched, or cyclic; and wherein $R_a$, $R_b$, $R_c$, $R_d$, $R_e$, . . . , $R_x$ is independently selected from hydrogen; deuterium; an alkyl group; an aryl group; an alkoxy; an amide comprising two substituents selected from an alkyl substituent, a silyl substituent, and a germyl substituent, wherein one or more of the silyl substituent and the germyl substituent comprises one or more of hydrogen substituents, deuterium substituents, or alkyl substituents; a hydrazide comprising three substituents selected from an alkyl substituent, a silyl substituent, and a germyl substituent, wherein one or more of the silyl substituent and the germyl substituent comprises one or more of hydrogen substituents, deuterium substituents, or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate.

Aspect 19: The apparatus of aspect 18, where each of $R_1$, $R_2$, and $R_3$ include the same element or the same compound.

Aspect 20: The apparatus of any of aspects 15 through 19, where D(1) comprises the chemical formula $X_1R_4R_5R_6$, D(2) comprises the chemical formula $X_2R_7R_8R_9$, D(3) comprises the chemical formula $X_3R_{10}R_{11}R_{12}$, D(4) comprises the chemical formula $X_4R_{13}R_{14}R_{15}$, D(5) comprises the chemical formula $X_5R_{16}R_{17}R_{18}$, or any combination thereof, wherein $X_1$, $X_2$, $X_3$, $X_4$, and $X_5$ each comprise at least one of germanium, tin, or silicon, wherein each of $R_4$, $R_5$, and $R_6$; each of $R_7$, $R_8$, and $R_9$; each of $R_{10}$, $R_{11}$, and $R_{12}$; each of $R_{13}$, $R_{14}$, and $R_{15}$; each of $R_{16}$, $R_{17}$, and $R_{18}$, or any combination thereof, are independently selected from hydrogen; deuterium; an alkyl group; an aryl group; an alkoxy; an amide comprising two substituents selected from an alkyl substituent, a silyl substituent, and a germyl substituent, wherein one or more of the silyl substituent and the germyl substituent comprises one or more of hydrogen substituents, deuterium substituents, or alkyl substituents; a hydrazide comprising three substituents selected from an alkyl substituent, a silyl substituent, and a germyl substituent, wherein one or more of the silyl substituent and the germyl substituent comprises one or more of hydrogen substituents, deuterium substituents, or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; an isofulminate; a $—SiR_aR_bR_c$ moiety; a $—GeR_aR_bR_c$ moiety; a $—SnR_aR_bR_c$ moiety; a $—SiR_aR_bCR_cR_dR_e$ moiety; a $—CR_aR_bSiR_cR_dR_e$ moiety; a $—SiR_aR_bGeR_cR_dR_e$ moiety; or a moiety containing a set of carbon atoms, silicon atoms, germanium atoms, tin atoms, or any combination thereof each fully saturated with respective substituents $R_a$, $R_b$, $R_c$, $R_d$, $R_e$, . . . , $R_x$ and comprising 1 to 10 carbon atoms, silicon atoms, germanium atoms, tin atoms, or any combination thereof distinct from any carbon, silicon, germanium, or tin within the respective substituents $R_a$, $R_b$, $R_c$, $R_d$, $R_e$, . . . , $R_x$, wherein x of $R_x$ is an index different than a of $R_a$, wherein the set of carbon atoms, silicon atoms, germanium atoms, tin atoms, or any combination thereof is linear, branched, or cyclic; and wherein $R_a$, $R_b$, $R_c$, $R_d$, $R_e$, . . . , $R_x$ is independently selected from hydrogen; deuterium; an alkyl group; an aryl group; an alkoxy; an amide comprising two substituents selected from an alkyl substituent, a silyl substituent, and a germyl substituent, wherein one or more of the silyl substituent and the germyl substituent comprises one or more of hydrogen substituents, deuterium substituents, or alkyl substituents; a hydrazide comprising three substituents selected from an alkyl substituent, a silyl substituent, and a germyl substituent, wherein one or more of the silyl substituent and the germyl substituent comprises one or more of hydrogen substituents, deuterium substituents, or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate.

Aspect 21: The apparatus of aspect 20, wherein each of $R_4$, $R_5$, and $R_6$; each of $R_7$, $R_8$, and $R_9$; each of $R_{10}$, $R_{11}$, and $R_{12}$; each of $R_{13}$, $R_{14}$, and $R_{15}$; each of $R_{16}$, $R_{17}$, and $R_{18}$, or any combination thereof comprise the same element or compound.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99% met, or at least 99.9% met.

As used herein, spatially relative terms, such as "adjacent," "beneath," "below," "lower," "bottom," "above," "upper," "top," "front," "rear," "left," "right," and the like, may be used for ease of description to describe one element's or feature's relationship to another element (s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one or ordinary skill in the art. The materials may be otherwise oriented (e.g., rotated 90 degrees, inverted, flipped), and the spatially relative descriptors used herein interpreted accordingly.

As used herein, the term "electronic device" may include, without limitation, a memory device, as well as semiconductor devices, which may or may not incorporate memory, such as a logic device, a processor device, or a radiofrequency (RF) device. Further, an electronic device may incorporate memory in addition to other functions such as, for example, a so-called "system on a chip" (SoC) including a processor and memory, or an electronic device including logic and memory. The electronic device may be a 3D electronic device, such as a 3D dynamic random access memory (DRAM) memory device, a 3D crosspoint memory device, or a 3D phase-change random access memory (PCRAM) memory device.

As used herein, the term"substrate" means and includes a foundation material or construction upon which components, such as those within a semiconductor device or electronic device are formed. The substrate may be a semiconductor substrate, a base material, a base semiconductor material on a supporting structure, a metal electrode, or a semiconductor substrate having one or more materials, structures, or regions formed thereon. The substrate may be a conventional silicon substrate, or other bulk substrate including a semiconductive material. As used herein, the term "bulk substrate" means and includes not only silicon wafers, but also silicon-on insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, regions, or junctions in or on the base semiconductor structure or foundation.

The terms "layer" and "level" used herein refer to an organization (e.g., a stratum, a sheet) of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, a wire, a conductive line, a conductive layer, or the like that provides a conductive path between components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:

reacting a first precursor with a base material to form a first compound comprising a first element on the base material, wherein the first compound comprises at least one of a Group XIII, Group XIV, or Group XV element; and reacting a second precursor with the first compound to form a second compound on the base material, wherein the second precursor comprises the chemical formula B-C(1)-D(1), B-C(1)-C(1)-D(1), B-C(2)-D(1)D(2), BD(3)-C(2)-C(2)-D(1)D(2), B-C(3)-D(1)D(2)D(3), or BD(4)D(5)-C(3)-C(3)-D(1)D(2)D(3), wherein each of B, D(1), D(2), D(3), D(4), and D(5) are a respective moiety that independently comprises at least one of germanium, tin, or silicon, and wherein C(1) comprises tellurium, sulfur, or selenium, wherein C(2) comprises antimony, arsenic, or phosphorous, wherein C(3) comprises silicon, germanium, or tin, and wherein at least one of the respective moieties present in the chemical formula comprises germanium or tin.

2. The method of claim 1, further comprising:

reacting a third precursor with the second compound to form a third compound on the second compound, wherein the third precursor comprises at least one of a Group XIII, Group XIV, or Group XV element; and reacting a fourth precursor with the third compound to form a fourth compound on the second compound, wherein the fourth precursor comprises one of tellurium, sulfur, antimony, arsenic, phosphorous, selenium, germanium, or tin bonded with a first moiety and a second moiety, the first moiety and the second moiety independently comprising at least one of germanium, tin, or silicon.

3. The method of claim 2, further comprising:

identifying a set of X precursor pairs, wherein each precursor pair of the set of X precursor pairs comprises one of a first set of precursors and one of a second set of precursors, wherein each precursor pair has an associated quantity of cycles, wherein X is an integer greater than or equal to 2, wherein each precursor of the first set of precursors comprises a Group XIII, Group XIV, or Group XV element, and wherein each precursor of the second set of precursors comprises one of tellurium, sulfur, antimony, arsenic, phosphorous, selenium, germanium, or tin bonded with two or more moieties, wherein each of the two or more moieties independently comprises germanium, tin, or silicon; and performing, according to the associated quantity of cycles for each precursor pair of the set of X precursor pairs and to form a respective film associated with the precursor pair, a reacting of the one of the first set of precursors to form a respective first compound and a reacting of the one of the second set of precursors with the first compound to form a respective second compound.

4. The method of claim 1, wherein:

B comprises the chemical formula R1R2R3A,

A comprises the at least one of germanium, tin, or silicon for B, and each of R1, R2, and R3 are independently selected from hydrogen; deuterium; an alkyl group; an aryl group; an alkoxy; an amide comprising two substituents selected from an alkyl substituent, a silyl substituent, and a germyl substituent, wherein one or more of the silyl substituent and the germyl substituent comprises one or more of hydrogen substituents, deuterium substituents, or alkyl substituents; a hydrazide comprising three substituents selected from an alkyl substituent, a silyl substituent, and a germyl substituent, wherein one or more of the silyl substituent and the germyl substituent comprises one or more of hydrogen substituents, deuterium substituents, or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; an isofulminate; a —SiRaRbRc moiety; a —GeRaRbRc moiety; a —SnRaRbRc moiety; a —SiRaRbCRcRdRe moiety; a —CRaRbSiRcRdRe moiety; a —SiRaRbGeRcRdRe moiety; or a moiety containing a set of carbon atoms, silicon atoms, germanium atoms, tin atoms, or any combination thereof each fully saturated with respective substituents Ra, Rb, Rc, Rd, Re, . . . , Rx and comprising 1 to 10 carbon atoms, silicon atoms, germanium atoms, tin atoms, or any combination thereof distinct from any carbon, silicon, germanium, or tin within the respective substituents Ra, Rb, Rc, Rd, Re, . . . , Rx, wherein x of Rx is an index different than a of Ra, wherein the set of carbon atoms, silicon atoms, germanium atoms, tin atoms, or any combination thereof is linear, branched, or cyclic; and wherein Ra, Rb, Rc, Rd, Re, . . . , Rx is independently selected from hydrogen; deuterium; an alkyl group; an aryl group; an alkoxy; an amide comprising two substituents selected from an alkyl substituent, a silyl substituent, and a germyl substituent, wherein one or more of the silyl substituent and the germyl substituent comprises one or more of hydrogen substituents, deuterium substituents, or alkyl substituents; a hydrazide comprising three substituents selected from an alkyl substituent, a silyl substituent, and a germyl substituent, wherein one or more of the silyl substituent and the germyl substituent comprises one or more of hydrogen substituents, deuterium substituents, or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate.

5. The method of claim 4, wherein each of R1, R2, and R3 comprise the same element or the same compound.

6. The method of claim 1, wherein:

D(1) comprises the chemical formula X1R4R5R6, D(2) comprises the chemical formula X2R7R8R9, D(3) comprises the chemical formula X3R10R11R12, D(4) comprises the chemical formula X4R13R14R15, D(5) comprises the chemical formula X5R16R17R18, or any combination thereof, wherein X1, X2, X3, X4, and X5 each comprise at least one of germanium, tin, or silicon, wherein each of R4, R5, and R6; each of R7, R8, and R9; each of R10, R11, and R12; each of R13, R14, and R15; each of R16, R17, and R18, or any combination thereof, are independently selected from hydrogen; deuterium; an alkyl group; an aryl group; an alkoxy; an amide comprising two substituents selected from an alkyl substituent, a silyl substituent, and a germyl substituent, wherein one or more of the silyl substituent and the germyl substituent comprises one or more of hydrogen substituents, deuterium substituents, or alkyl substituents; a hydrazide comprising three substituents selected from an alkyl substituent, a silyl substituent, and a germyl substituent, wherein one or more of the silyl substituent and the germyl substituent comprises one or more of hydrogen substituents, deuterium substituents, or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; an isofulminate; a —SiRaRbRc moiety; a —GeRaRbRc moiety; a —SnRaRbRc moiety; a —SiRaRbCRcRdRe moiety; a —CRaRbSiRcRdRe moiety; a —SiRaRbGeRcRdRe moiety; or a moiety containing a set of carbon atoms, silicon atoms, germanium atoms, tin atoms, or any combination thereof each fully saturated with respective substituents Ra, Rb, Rc, Rd, Re, . . . , Rx and comprising 1 to 10 carbon atoms, silicon atoms, germanium atoms, tin atoms, or any combination thereof distinct from any carbon, silicon, germanium, or tin within the respective substituents Ra, Rb, Rc, Rd, Re, . . . , Rx, wherein x of Rx is an index different than a of Ra, wherein the set of carbon atoms, silicon atoms, germanium atoms, tin atoms, or any combination thereof is linear, branched, or cyclic; and wherein Ra, Rb, Rc, Rd, Re, . . . , Rx is independently selected from hydrogen; deuterium; an alkyl group; an aryl group; an alkoxy; an amide comprising two substituents selected from an alkyl substituent, a silyl substituent, and a germyl substituent, wherein one or more of the silyl substituent and the germyl substituent comprises one or more of hydrogen substituents, deuterium substituents, or alkyl substituents; a hydrazide comprising three substituents selected from an alkyl substituent, a silyl substituent, and a germyl substituent, wherein one or more of the silyl substituent and the germyl substituent comprises one or more of hydrogen substituents, deuterium substituents, or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate.

7. The method of claim 6, wherein each of R4, R5, and R6; each of R7, R8, and R9; each of R10, R11, and R12; each of R13, R14, and R15; each of R16, R17, and R18, or any combination thereof comprise the same element or compound.

8. A method, comprising:

forming a plurality of stacks of materials on a substrate;

exposing the plurality of stacks of materials to a first precursor to form a first compound comprising a first element on the plurality of stacks of materials, wherein the first compound comprises at least one of a Group XIII, Group XIV, or Group XV element; and exposing the plurality of stacks of materials to a second precursor to form a second compound on the plurality of stacks of materials, wherein the second precursor comprises the chemical formula B-C(1)-D(1), B-C(1)-C(1)-D(1), B-C(2)-D(1)D(2), BD(3)-C(2)-C(2)-D(1)D(2), B-C(3)-D(1)D(2)D(3), or BD(4)D(5)-C(3)-C(3)-D(1)D(2)D(3), and wherein each of B, D(1), D(2), D(3), D(4), and D(5) are a respective moiety that independently comprises at least one of germanium, tin, or silicon, and wherein C(1) comprises tellurium, sulfur, or selenium, wherein C(2) comprises antimony, arsenic, or phosphorous, wherein C(3) comprises silicon, germanium, or tin, and wherein at least one of the respective moieties present in the chemical formula comprises germanium or tin.

9. The method of claim 8, further comprising:

exposing the second compound to a third precursor to form a third compound on the plurality of stacks of materials, wherein the third precursor comprises at least one of a Group XIII, Group XIV, or Group XV element; and exposing the third compound to a fourth precursor to form a fourth compound on the second compound, wherein the fourth precursor comprises one of tellurium, sulfur, antimony, arsenic, phosphorous, selenium, germanium, or tin bonded with a first moiety and a second moiety, the first moiety and the second moiety independently comprising at least one of germanium, tin, or silicon.

10. The method of claim 9, further comprising:

identifying a set of X precursor pairs, wherein each precursor pair of the set of X precursor pairs comprises one of a first set of precursors and one of a second set of precursors, wherein each precursor pair has an associated quantity of cycles, wherein X is an integer greater than 2, wherein each precursor of the first set of precursors comprises at least one of a Group XIII, Group XIV, or Group XV element, and wherein each precursor of the second set of precursors comprises one of tellurium, sulfur, antimony, arsenic, phosphorous, selenium, germanium, or tin bonded with two or more moieties, wherein each of the two or more moieties independently comprises germanium, tin, or silicon; and performing, according to the associated quantity of cycles for each precursor pair of the set of X precursor pairs and to form a respective film associated with the precursor pair, an exposing with the one of the first set of precursors to form a respective first compound and an exposing of the respective first compound with the one of the second set of precursors to form a respective second compound.

11. The method of claim 8, wherein:

B comprises the chemical formula R1R2R3A,

A comprises the at least one of germanium, tin, or silicon for B, and each of R1, R2, and R3 are independently selected from hydrogen; deuterium; an alkyl group; an aryl group; an alkoxy; an amide comprising two substituents selected from an alkyl substituent, a silyl substituent, and a germyl substituent, wherein one or more of the silyl substituent and the germyl substituent comprises one or more of hydrogen substituents, deuterium substituents, or alkyl substituents; a hydrazide comprising three substituents selected from an alkyl substituent, a silyl substituent, and a germyl substituent, wherein one or more of the silyl substituent and the germyl substituent comprises one or more of hydrogen substituents, deuterium substituents, or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; an isofulminate; a —SiRaRbRc moiety; a —GeRaRbRc moiety; a —SnRaRbRc moiety; a —SiRaRbCRcRdRe moiety; a —CRaRbSiRcRdRe moiety; a —SiRaRbGeRcRdRe moiety; or a moiety containing a set of carbon atoms, silicon atoms, germanium atoms, tin atoms, or any combination thereof each fully saturated with respective substituents Ra, Rb, Rc, Rd, Re, . . . , Rx and comprising 1 to 10 carbon atoms, silicon atoms, germanium atoms, tin atoms, or any combination thereof distinct from any carbon, silicon, germanium, or tin within the respective substituents Ra, Rb, Rc, Rd, Re, . . . , Rx, wherein x of Rx is an index different than a of Ra, wherein the set of carbon atoms, silicon atoms, germanium atoms, tin atoms, or any combination thereof is linear, branched, or cyclic; and wherein Ra, Rb, Rc, Rd, Re, . . . , Rx is independently selected from hydrogen; deuterium; an alkyl group; an aryl group; an alkoxy; an amide comprising two substituents selected from an alkyl substituent, a silyl substituent, and a germyl substituent, wherein one or more of the silyl substituent and the germyl substituent comprises one or more of hydrogen substituents, deuterium substituents, or alkyl substituents; a hydrazide comprising three substituents selected from an alkyl substituent, a silyl substituent, and a germyl substituent, wherein one or more of the silyl substituent and the germyl substituent comprises one or more of hydrogen substituents, deuterium substituents, or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate.

12. The method of claim 11, wherein each of R1, R2, and R3 comprise the same element or the same compound.

13. The method of claim 8, wherein:

D(1) comprises the chemical formula X1R4R5R6, D(2) comprises the chemical formula X2R7R8R9, D(3) comprises the chemical formula X3R10R11R12, D(4) comprises the chemical formula X4R13R14R15, D(5) comprises the chemical formula X5R16R17R18, or any combination thereof, wherein X1, X2, X3, X4, and X5 each comprise at least one of germanium, tin, or silicon, wherein each of R4, R5, and R6; each of R7, R8, and R9; each of R10, R11, and R12; each of R13, R14, and R15; each of R16, R17, and R18, or any combination thereof, are independently selected from hydrogen; deuterium; an alkyl group; an aryl group; an alkoxy; an amide comprising two substituents selected from an alkyl substituent, a silyl substituent, and a germyl substituent, wherein one or more of the silyl substituent and the germyl substituent comprises one or more of hydrogen substituents, deuterium substituents, or alkyl substituents; a hydrazide comprising three substituents selected from an alkyl substituent, a silyl substituent, and a germyl substituent, wherein one or more of the silyl substituent and the germyl substituent comprises one or more of hydrogen substituents, deuterium substituents, or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; an isofulminate; a —SiRaRbRc moiety; a —GeRaRbRc moiety; a —SnRaRbRc moiety; a —SiRaRbCRcRdRe moiety; a —CRaRbSiRcRdRe moiety; a —SiRaRbGeRcRdRe moiety; or a moiety containing a set of carbon atoms, silicon atoms, germanium atoms, tin atoms, or any combination thereof each fully saturated with respective substituents Ra, Rb, Rc, Rd, Re, . . . , Rx and comprising 1 to 10 carbon atoms, silicon atoms, germanium atoms, tin atoms, or any combination thereof distinct from any carbon, silicon, germanium, or tin within the respective substituents Ra, Rb, Rc, Rd, Re, . . . , Rx, wherein x of Rx is an index different than a of Ra, wherein the set of carbon atoms, silicon atoms, germanium atoms, tin atoms, or any combination thereof is linear, branched, or cyclic; and wherein Ra, Rb, Rc, Rd, Re, . . . , Rx is independently selected from hydrogen; deuterium; an alkyl group; an aryl group; an alkoxy; an amide comprising two substituents selected from an alkyl substituent, a silyl substituent, and a germyl substituent, wherein one or more of the silyl substituent and the germyl substituent comprises one or more of hydrogen substituents, deuterium substituents, or alkyl substituents; a hydrazide comprising three substituents selected from an alkyl substituent, a silyl substituent, and a germyl substituent, wherein one or more of the silyl substituent and the germyl substituent comprises one or more of hydrogen substituents, deuterium substituents, or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate.

14. The method of claim 13, wherein each of R4, R5, and R6; each of R7, R8, and R9; each of R10, R11, and R12; each of R13, R14, and R15; each of R16, R17, and R18, or any combination thereof comprise the same element or compound.

* * * * *